(12) United States Patent
Bultitude et al.

(10) Patent No.: US 10,984,955 B2
(45) Date of Patent: Apr. 20, 2021

(54) ELECTRONIC COMPONENT STRUCTURES WITH REDUCED MICROPHONIC NOISE

(71) Applicant: KEMET Electronics Corporation, Simpsonville, SC (US)

(72) Inventors: John Bultitude, Simpsonville, SC (US); John E. McConnell, Simpsonville, SC (US); Galen W. Miller, Simpsonville, SC (US)

(73) Assignee: KEMET Electronics Corporation, Fort Lauderdale, FL (US)

( * ) Notice: Subject to any disclaimer, the term of this patent is extended or adjusted under 35 U.S.C. 154(b) by 0 days.

(21) Appl. No.: 16/439,237

(22) Filed: Jun. 12, 2019

(65) Prior Publication Data

US 2019/0304698 A1    Oct. 3, 2019

Related U.S. Application Data

(60) Division of application No. 15/285,210, filed on Oct. 4, 2016, now Pat. No. 10,366,836, which is a
(Continued)

(51) Int. Cl.
*H01G 4/30* (2006.01)
*B23K 1/00* (2006.01)
(Continued)

(52) U.S. Cl.
CPC .............. *H01G 4/30* (2013.01); *B23K 1/008* (2013.01); *B23K 1/0016* (2013.01); *B23K 1/0053* (2013.01); *B23K 1/203* (2013.01); *B23K 35/0227* (2013.01); *B23K 35/3613* (2013.01); *H01G 4/232* (2013.01); *H01G 4/2325* (2013.01); *H01G 4/38* (2013.01); *B23K 2101/40* (2018.08); *B23K 2101/42* (2018.08); *H01G 4/0085* (2013.01); *H01G 4/12* (2013.01);
(Continued)

(58) Field of Classification Search
CPC .................................................... H01G 4/30
USPC ......................................................... 174/260
See application file for complete search history.

(56) References Cited

U.S. PATENT DOCUMENTS 5,195,019 A * 3/1993 Hertz .................. H01G 4/30
29/25.42
5,948,533 A * 9/1999 Gallagher .......... B23K 35/0222
174/255
(Continued)

*Primary Examiner* — Stanley Tso
(74) *Attorney, Agent, or Firm* — Joseph T. Guy; Patent Filing Specialist Inc.

(57) ABSTRACT

An electronic device is described wherein the electronic device comprises a substrate with a first conductive metal layer and a second conductive metal layer. A first microphonic noise reduction structure is in electrical contact with the first conductive metal layer wherein the first microphonic noise reduction layer comprises at least one of the group consisting of a compliant non-metallic layer and a shock absorbing conductor comprising offset mounting tabs with a space there between coupled with at least one stress relieving portion. An electronic component comprising a first external termination of a first polarity and a second
(Continued)

external termination of a second polarity is integral to the electronic device and the first microphonic noise reduction structure and the first external termination are adhesively bonded by a transient liquid phase sintering adhesive.

37 Claims, 22 Drawing Sheets

Related U.S. Application Data continuation-in-part of application No. 13/959,954, filed on Aug. 6, 2013, now Pat. No. 9,472,342, which is a continuation-in-part of application No. 13/114,126, filed on May 24, 2011, now Pat. No. 8,902,565.

(60) Provisional application No. 61/348,318, filed on May 26, 2010, provisional application No. 61/729,783, filed on Nov. 26, 2012.

(51) Int. Cl.
| | | |
|---|---|---|
| B23K 1/005 | (2006.01) |
| B23K 1/008 | (2006.01) |
| B23K 1/20 | (2006.01) |
| B23K 35/36 | (2006.01) |
| B23K 35/02 | (2006.01) |
| H01G 4/38 | (2006.01) |
| H01G 4/232 | (2006.01) |
| H01G 4/008 | (2006.01) |
| H01G 4/12 | (2006.01) |
| B23K 101/40 | (2006.01) |
| B23K 101/42 | (2006.01) |

(52) U.S. Cl.
CPC ............ *H01L 2224/83825* (2013.01); *H01L 2924/01322* (2013.01); *H01L 2924/01327* (2013.01); *H01L 2924/1461* (2013.01); *Y10T 29/435* (2015.01)

(56) References Cited

U.S. PATENT DOCUMENTS

| | | | | |
|---|---|---|---|---|
| 2004/0084399 A1* | 5/2004 | Cook | .................. | H05K 3/26 |
| | | | | 216/13 |
| 2005/0056446 A1* | 3/2005 | Ogawa | .............. | H01L 23/49582 |
| | | | | 174/551 |
| 2007/0252112 A1* | 11/2007 | Jun | .................. | H05K 3/323 |
| | | | | 252/500 |
| 2008/0174931 A1* | 7/2008 | Skamser | .............. | H01G 2/065 |
| | | | | 361/272 |
| 2009/0321750 A1* | 12/2009 | Namioka | .............. | H01L 33/486 |
| | | | | 257/81 |
| 2010/0123995 A1* | 5/2010 | Otsuka | .................. | H01G 2/06 |
| | | | | 361/308.1 |
| 2011/0147933 A1* | 6/2011 | Wu | .................. | H01L 21/6835 |
| | | | | 257/741 |
| 2011/0278054 A1* | 11/2011 | Lee | .................. | H05K 1/111 |
| | | | | 174/260 |
| 2011/0278732 A1* | 11/2011 | Yu | .................. | H01L 23/481 |
| | | | | 257/774 |
| 2012/0067617 A1* | 3/2012 | Chun | .................. | C09D 5/38 |
| | | | | 174/126.1 |

* cited by examiner

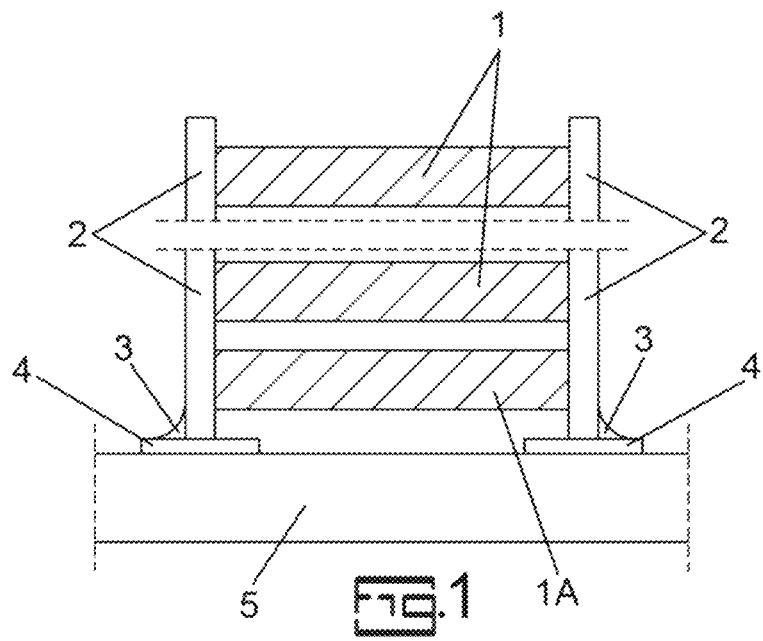
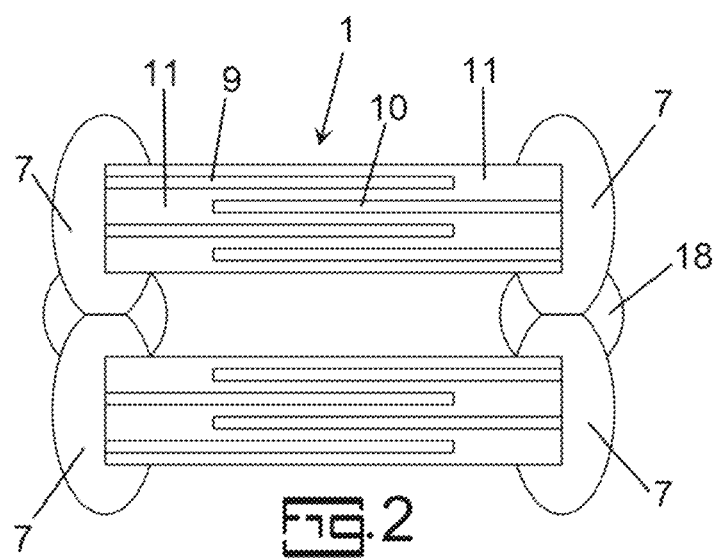

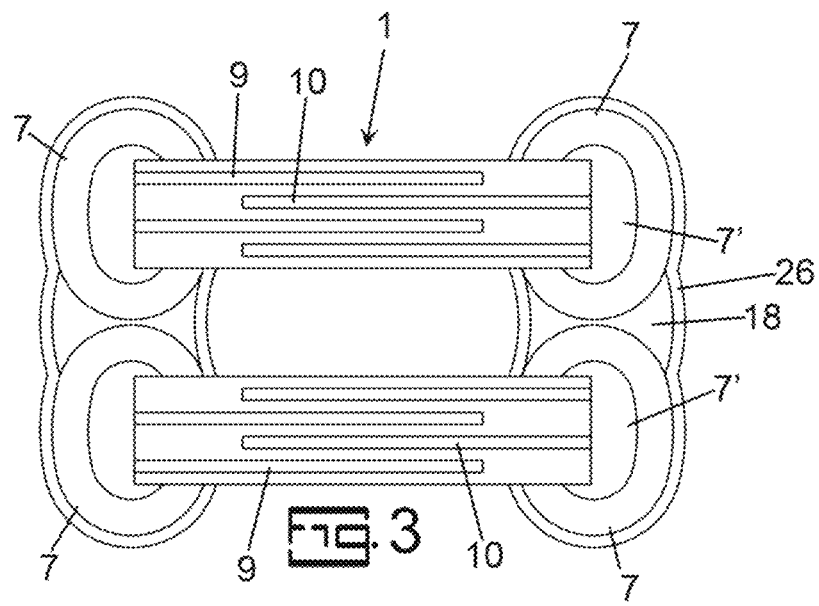
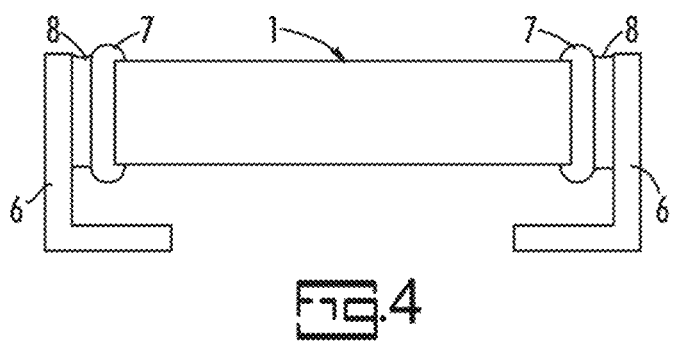
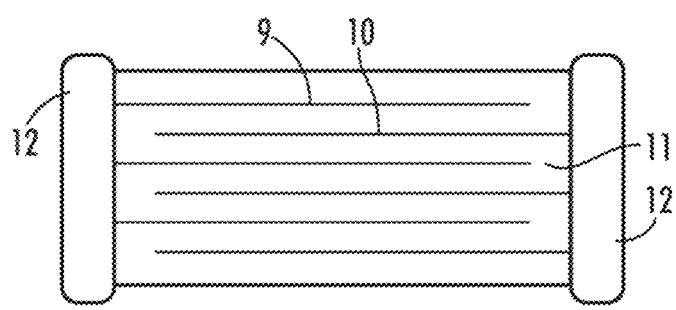

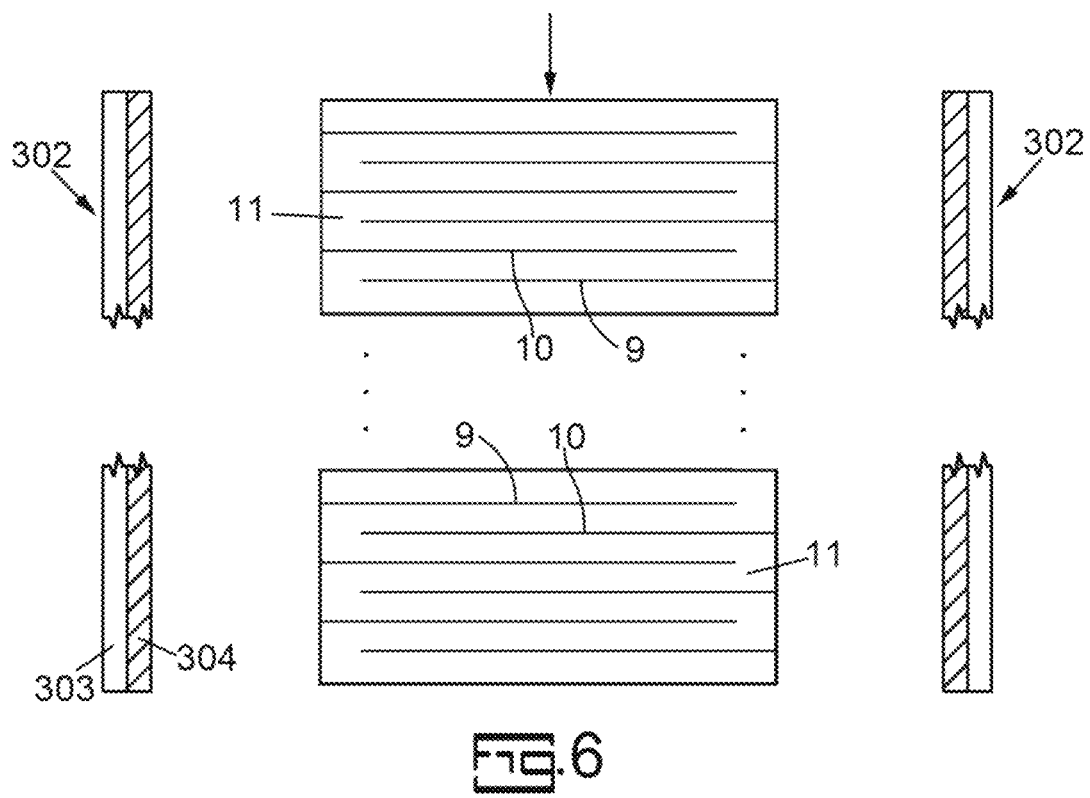

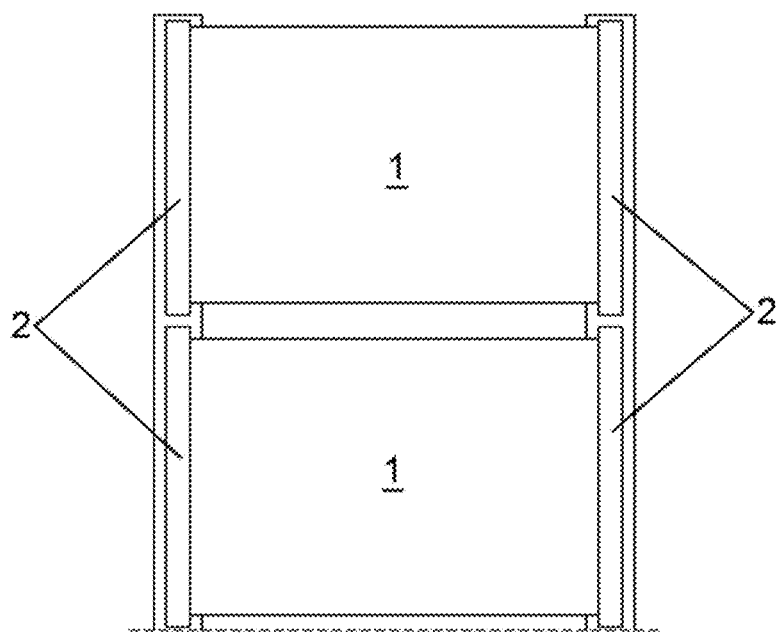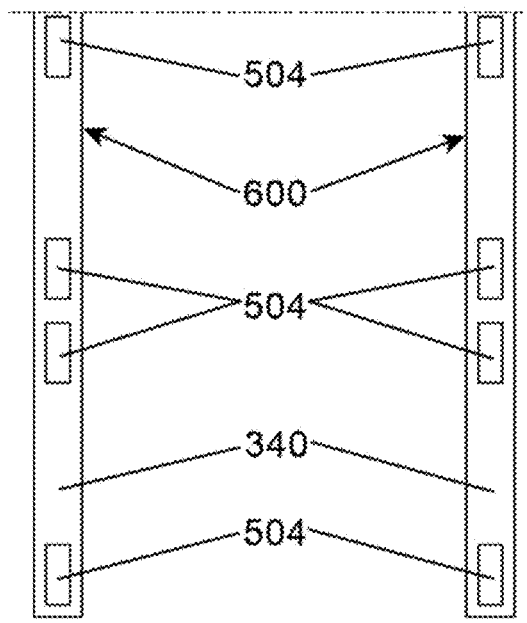
Fig. 38

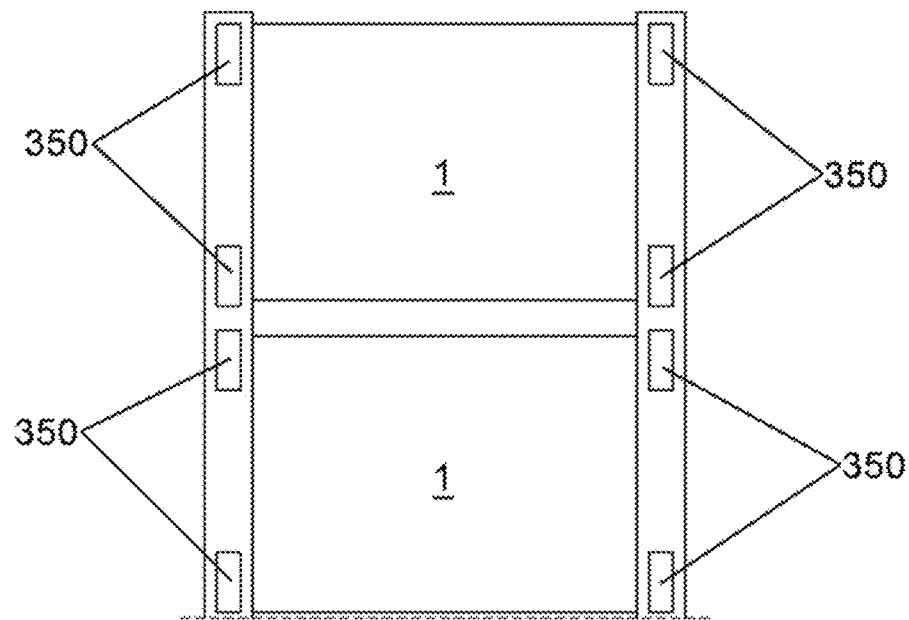
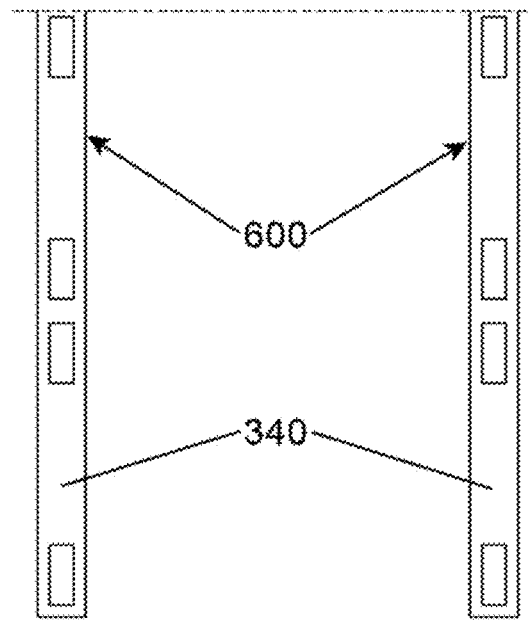
Fig. 39

ELECTRONIC COMPONENT STRUCTURES WITH REDUCED MICROPHONIC NOISE

CROSS-REFERENCE TO RELATED APPLICATIONS

The present application is a divisional application of pending U.S. patent application Ser. No. 15/285,210 filed Oct. 4, 2016 which, in turn, is a continuation-in-part of U.S. patent application Ser. No. 13/959,954 filed Aug. 6, 2013 now U.S. Pat. No. 9,472,342 issued Oct. 18, 2016 which, in turn, is a continuation-in-part of U.S. patent application Ser. No. 13/114,126 filed May 24, 2011, now U.S. Pat. No. 8,902,565 issued Dec. 2, 2014, which claims priority to expired U.S. Provisional Patent Application No. 61/348,318 filed May 26, 2010 all of which are incorporated herein by reference. U.S. patent application Ser. No. 13/959,954 filed Aug. 6, 2013 now U.S. Pat. No. 9,472,342 issued Oct. 18, 2016 also claims priority to U.S. Provisional Patent Application No. 61/729,783 filed Nov. 26, 2012 which is also incorporated herein by reference.

BACKGROUND

The present invention is related to electronic components and methods of making electronic components. More specifically, the present invention is related to electronic components and methods of making electronic components, particularly stacked leadless multi-layered ceramic capacitors with improved terminations, for attachment of an external lead or lead frame or for direct lead-less attachment of the electronic component such that the component can subsequently be connected to an electronic circuit by a variety of secondary attachment materials and processes. Even more specifically, the present invention is related multi-layered ceramic capacitors, which can be leadless and stacked, with reduced microphonic noise.

In general, the method of formation of a conductive termination, and materials used, is critical for reliable performance. The performance in use, when subsequently assembled in an electronic circuit, is directly related to the conductive termination. Historically, lead (Pb) based solders have been used to attach components to electronic circuit boards or to attach external leads to the electronic component. More recently, the use of hazardous substances in electrical and electronic equipment, as typified by the European RoHS legislation, has restricted the use of lead (Pb) in solder which has led the industry to seek various alternatives.

U.S. Pat. No. 6,704,189, for example, describes the use of Sn based solder with 10-30% Sb to form a contact between external leads and plated Multi-Layer Ceramic Capacitor (MLCC) components. However, the solders described have a liquidus below 270° C. By way of comparison, high-Pb solders such as Sn10/Pb88/Ag2 have a liquidus of about 290° C. It is generally recognized in the industry that a melting point at least 30° C. above any subsequent processing temperature is desirable to insure reliability of the external lead attachment. The ability to achieve high melting points has become critical since solders based on Sn, Ag and Cu, which are referred to in the art as SAC solders, are now becoming the common choice for attachment in Pb-free circuits. SAC solders have to be reflowed at higher temperatures, typically about 260° C., than the older Pb-based alternatives such as Sn63/Pb37 which had a melting point of 183° C. The contact material to the external lead, or for forming the terminal, must be capable of sustaining temperatures well above this in order not to melt, or partially melt, which causes significant reliability issues. A temperature of at least 30° C. above the melting point of the SAC solder is desired. Due to materials compatibility and higher processing temperatures involved with the semi-conductor technologies, gold/germanium, gold/silicon, and gold/tin alloys were developed to attach a die to substrates. Since the die and their mating surfaces have a low difference in thermal coefficient of expansion CTE, these alloys provided high temperature capabilities and high strengths having tensile strengths in the range of 20,000 psi and shear strengths in the range of 25,000 psi. However, these materials also require higher processing temperatures due to their higher melting points of generally above 350° C. Their high process temperature has prevented their wider use in electronics. Tin and indium have been added to combinations of Zn, Al, Ge and Mg to form higher temperature lead free solders. However, zinc and aluminum powder tend to form oxide films on the surface which are associated with poor wettability in the subsequent solders making them impractical to use. Solders with tin, zinc, cadmium, and aluminum are available but they are typically used in their eutectic alloy form because their alloys, other than eutectics, have wide plastic ranges of 50-175° C. limiting their use to very specific applications outside of electronics. Cadmium, zinc, and silver alloy solders are good for soldering aluminum. Once the liquidus temperatures move above 450° C. the solders are referred to as brazing solders which are typically used in structural applications rather than electrical applications. Methods of forming Pb-free, high temperature bonds to capacitors that retain their integrity above 260° C. and are economical to manufacture have therefore yet to be realized.

The following patents describe the materials and processes of TLPS with respect to forming conductive bonds. U.S. Pat. No. 5,038,996 describes coating two mating surfaces one with Sn and the other with Pb and forming a joint by raising the process temperature to a temperature of about 183° C. which is slightly below the melting point of Sn. Transient Liquid Phase Sintering (TLPS) formulations disclosed in U.S. Pat. No. 5,853,622 combine TLPS materials with cross linking polymers to create a conductive adhesive having improved electrical conductivity as a result of intermetallic interfaces between the metal surfaces created by TLPS process. The spraying of two mating surfaces, with one surface having a low temperature melting material and the mating surface having a compatible higher melting temperature material forms a joint when heating to the melting point of the lower temperature material as discussed in U.S. Pat. No. 5,964,395.

U.S. Pat. No. 5,221,038 describes the use of SnBi or SnIn for soldering discrete components such as resistors and the like to printed circuit boards using the TLPS process. The use of Ag/Sn/Bi coated to two mating surfaces to mount electronic modules to substrates was disclosed in U.S. Pat. No. 6,241,145. U.S. Pat. Publ. No. 2002/0092895 discusses the deposition of materials on two mating surfaces, a substrate and the surface of the bumps on a flip chip, elevated to a temperature to cause diffusion between the materials to create a TLPS compatible alloy. U.S. Pat. Publ. No. 2006/0151871 describes the use of TLPS in forming packages containing SiC or other semiconductor devices bonded to other components or conductive surfaces. U.S. Pat. Publ. No. 2007/0152026 describes the placement of TLPS compatible materials on mating surfaces followed by reflowing the lower melting point material and then isothermal aging to complete the diffusion process where the two devices to be joined are a micro-electromechanical system (MEMS) device to a microelectronic circuit. U.S. Pat. No. 7,023,089 describes the use of TLPS to bond heat spreaders made from copper, black diamond, or black diamond copper composite to silicon die. These patents and applications describe the processing of TLPS to bond components to circuit boards but do not contain any teaching regarding their use to form terminations on electronic components or in the attachment of components to lead frames.

In a more recent development U.S. Pat. Publ. No. 2009/0296311 describes a high temperature diffusion bonding process that welds the lead to the inner electrodes of a multi-layer ceramic component. TLPS materials are plated on the faces of mating surfaces to be joined together by introducing heat to initiate the diffusion process. In this case, intimate mutual contact across the surfaces is required between the component and lead frame to facilitate the diffusion. This limits the application to the joining of surfaces that can form an intimate line of contact and this application cannot accommodate components of differing length connected to the lead frame. Furthermore, high temperatures in the range of 700 to 900° C. are described to achieve a welded bond. These high formation temperatures require careful process design, such as preheating stages, to avoid thermal shock damage to the multi-layer ceramic components and even then this may not be suitable for all materials.

Other Pb free attachment technologies are described in the art yet none are adequate.

Solder is an alloy consisting of two or more metals that have only one melting point, which is always lower than that of the metal having the highest melting point and generally has a melting point of less than about 310° C. depending on the alloy. Solder can be reworked, meaning it can be reflowed multiple times, thus providing a means to remove and replace defective components. Solders also make metallurgical bonds by forming intermetallic interfaces between the surfaces they are joining. As solders wet to their adjoining surfaces, they actually flow outward and spread across the surface areas to be joined.

MLCC's are widely used in a variety of applications. Most typically an MLCC, or a stack of MLCC's, is mounted to a circuit board as a discrete component. A particular problem associated with MLCC's is their propensity to crack when subjected to stress such as bending of the circuit board. To avoid these stress fractures the MLCC's are mounted between lead frames, such as one of each polarity, and the lead frames are then attached to the circuit board by soldering and the like. The lead frames have been considered in the art to be a necessity and much effort has been spent designing lead frames capable of withstanding the stress associated with board flexure without imparting the stress on the MLCC. The lead frame design and material is particularly difficult due to the differences in coefficient of thermal expansion and the desire to minimize equivalent series resistance (ESR), inductance and other parasitics. In spite of the desire to eliminate the lead frame those of skill in the art have not been able to do so since any flexure of the circuit board transfers directly to the MLCC virtually insuring damage to the MLCC.

Multilayer ceramic capacitors, or MLCC's, manufactured with polarized dielectrics such as barium titanate are prone to microphonic noise. Microphonic noise is believed to be caused by the electrostriction, also referred to as the piezoelectric effect, which is the movement of ceramic that occurs in the presence of an applied electric filed. The ceramic movement can be magnified by the circuit board on which the component is mounted ultimately producing an audible noise when electric field is applied. Leads mitigate the microphonic noise. With leadless capacitors, and particularly leadless stacks of capacitors mounted on a circuit board, microphonic noise can be enhanced which is highly undesirable, particularly, in portable devices such as cell phones and the like. It is therefore a desire to achieve the advantages of a leadless capacitor, and particularly leadless capacitor stack, while minimizing or eliminating microphonic noise.

In spite of the ongoing, and intensive effort, the art still lacks an adequate capacitor. There is an ongoing need for lead connections with improved reliability for high temperature applications, especially lead(Pb) free and especially capacitors which with minimal or no microphonic noise.

SUMMARY

It is an object of the invention to provide an improved method for forming metallic external terminals, suitable for attachment to a lead frame or for use as a leadless capacitor stack, which can be reflowed without compromising the metallic external leads or lead frame attachment during subsequent assembly into an electronic circuit.

It is another object of the invention to provide an improved method for forming terminations that are suitable for the attachment of a lead frame or as a leadless termination which can withstand a subsequent solder reflow process to an electronic circuit without compromising the termination or the lead attachment interconnect.

It is another object of this invention to provide an improved method for forming terminations that are suitable for the attachment of a lead frame or as a leadless termination which can withstand subsequent solder reflow process to an electronic circuit without compromising the termination or the lead attachment interconnect.

It is another object of the invention to provide a stacked MLCC which can be mounted without a lead frame wherein board flexure does not cause the expected amount of stress cracking of the MLCC's.

It is another object of this invention to form terminations or interconnects on electronic components having the advantage of low initial process temperatures but having high subsequent melting point temperatures without the use of banned materials such as lead or cadmium or large amounts of costly materials such as gold.

A particular feature of the present invention is the ability to provide a leadless MLCC, or stack of MLCC's, without microphonic noise propagation.

These and other advantages, as will be realized, are provided in a capacitor stack comprising multilayered ceramic capacitors wherein each multilayered ceramic capacitor comprises first electrodes and second electrodes in an alternating stack with a dielectric between each first electrode and each adjacent second electrode. The first electrodes terminate at a first side and the second electrodes at a second side. A first transient liquid phase sintering conductive layer is on the first side and in electrical contact with each first electrode; and a second transient liquid phase sintering conductive layer is on the second side and in electrical contact with each second electrode.

Yet another embodiment is provided in a method of forming an electrical component comprising:
providing multilayered ceramic capacitors wherein each multilayered ceramic capacitor comprises first electrodes and second electrodes in an alternating stack with a dielectric between each first electrode and adjacent second electrode wherein said first electrodes terminate at a first side and said second electrodes terminate at a second side;
stacking the multilayered ceramic capacitors such that each first side is parallel and each said second side is parallel;
forming a first layer of a first component of a transient liquid phase sintering conductive layer;
forming a second layer of the first component of the transient liquid phase sintering conductive layer;
contacting the first layer and the second layer with a second component of transient liquid phase sintering conductive layer;
heating to a first temperature sufficient to form a first transient liquid phase sintering conductive layer comprising the first component and the second component wherein the first transient liquid phase sintering conductive layer is in electrical contact with the first electrodes and forming a second transient liquid phase sintering conductive layer comprising the first component and the second component wherein the second transient liquid phase sintering conductive layer is in electrical contact with the second electrodes thereby forming a stack capacitor.

Yet another embodiment is provided in a method of forming a stack of multilayered ceramic capacitors comprising:
providing a multiplicity of multilayered ceramic capacitors wherein each multilayered ceramic capacitor comprises:
first electrodes and second electrodes in an alternating stack with a dielectric between each first electrode and each adjacent second electrode wherein the first electrodes have a first polarity and terminate at a first side of the multilayered ceramic capacitor and the second electrodes have a second polarity and terminate at a second side of the multilayered ceramic capacitor;
forming a stack of the multilayered ceramic capacitors;
forming a first transient liquid phase sintering conductive layer in electrical contact with first electrodes of adjacent multilayered ceramic capacitors; and
forming a second transient liquid phase sintering conductive layer in electrical contact with second electrodes of adjacent multilayered ceramic capacitors.

These and other advantages, as will be realized, are provided in an electronic structure comprising a first conductive metal layer and a second conductive metal layer. A first compliant non-metallic layer is on the first conductive metal layer wherein the first compliant non-metallic layer comprises a gap. An electronic component comprising a first external termination of a first polarity and a second external termination of a second polarity is integral to the electronic structure and a transient liquid phase sintering adhesive is in electrical contact with the first external termination and the first conductive layer wherein the conductive adhesive extends through the gap.

Yet another embodiment is provided in an electronic device. The electronic device comprises a substrate with a first conductive metal layer and a second conductive metal layer. A first microphonic noise reduction structure is in electrical contact with the first conductive metal layer wherein the first microphonic noise reduction layer comprises at least one of the group consisting of a compliant non-metallic layer and a shock absorbing conductor comprising offset mounting tabs with a space there between coupled with at least one stress relieving portion. An electronic component comprising a first external termination of a first polarity and a second external termination of a second polarity is integral to the electronic device and the first microphonic noise reduction structure and the first external termination are adhesively bonded by a transient liquid phase sintering adhesive.

BRIEF DESCRIPTION OF DRAWINGS

FIG. 1 is a side schematic view of an embodiment of the invention.
FIG. 2 is a cross-sectional schematic view of an embodiment of the invention.
FIG. 3 is a cross-sectional schematic view of an embodiment of the invention.
FIG. 4 is a side schematic view of an embodiment of the invention.
FIG. 5 is a cross-sectional schematic view of an embodiment of the invention.
FIG. 6 is a cross-sectional schematic exploded view of an embodiment of the invention.

FIG. 38 is a schematic top view of an embodiment of the invention.

FIG. 39 is a schematic bottom view of an embodiment of the invention.

DESCRIPTION

Figure 7:
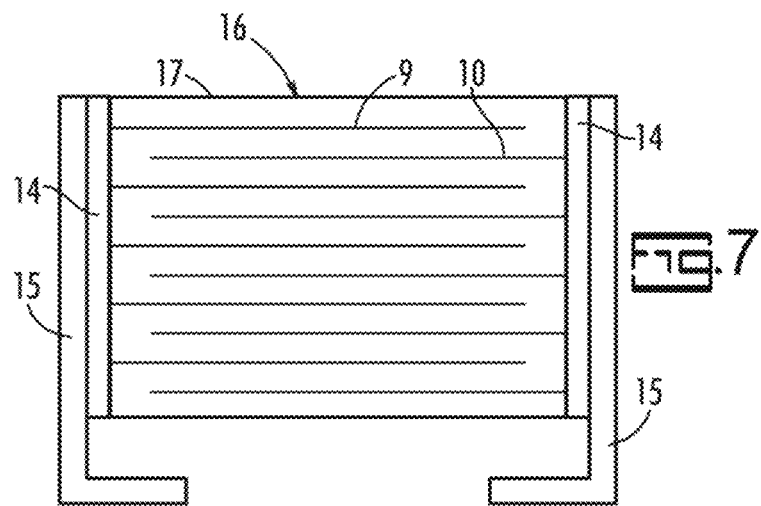
FIG. 7 is a cross-sectional schematic view of an embodiment of the invention.

The present invention is related to an MLCC with improved bonding to an external lead or lead frame or for improved bonding between MLCC's in a stack for use as a lead-less MLCC having significantly reduced microphonic noise propagation. More specifically, the present invention is related to structures designed to minimize the solder fillet in such a way as to reduce the transference of mechanical energy thereby minimize the microphonic noise.

The present invention is related to the use of transient liquid phase sintering (TLPS) adhesives to form a termination to the component or to attach external leads to the component. The improved terminations have the advantage of being able to accommodate different surface finishes as well as components of differing lengths. Furthermore, since no solder balls are formed components can be stacked on top of each other without the gaps normally required for cleaning as with solder attachment technology. The TLPS can be directly bonded with the inner electrodes of the component and the termination can be formed at low temperature. In an embodiment higher density terminations can be prepared by using a thermo-compression process thereby forming improved external lead attachment bonds.

Solders are alloys which do not undergo a change in composition after the first reflow. Solders have only one melting point and can be remelted an indefinite number of times. The most common solder is 60% Sn40% Pb. Solders have been the materials of choice in electronics to provide the mechanical and electrical interconnects between components and circuit boards or substrates. Solders are very well suited for mass volume production assembly processes. The physical properties of solder can be altered simply by changing the ratios or the metals used to create a solder alloy. When solder is referenced from this point on it will imply an alloy of at least two metals that can be remelted an indefinite number of times.

Conductive epoxy/adhesives are typically cross linking polymers that are filled with conductive fillers, typically silver or gold flakes or particles, to create electrically conductive epoxy polymeric bonds. Unlike solders, conductive adhesives can only be cured once and cannot be reworked. As the metal particles touch each other they form a meandering conductive path through the epoxy to create an electrical connection between two or more components. Conductive epoxies/adhesives, solders, and epoxy solders typically have temperature limitations of less than 315° C.

Polymer solder is another material being used to create a metallurgical connection between two or more compatible metals. Polymer solder is the combining of a solder with cross linking polymers with epoxy being a typical example. The solder provides the electrical conductivity and the bulk of the mechanical strength of the joint while the epoxy forms polymeric bonds that provide additional mechanical strength and increase the temperature capability over the solder itself. Polymer solder is preferably not used with microphonic noise reduction technology.

Transient liquid phase sintering (TLPS) bonds are distinguishable from solders. TLPS materials are mixtures of two or more metals or metal alloys prior to exposure to elevated temperatures thereby distinguishing the thermal history of the material. TLPS materials exhibit a low melting point prior to exposure to elevated temperatures, and a higher melting point following exposure to these temperatures. The initial melting point is the result of the low temperature metal or an alloy of two low temperature metals. The second melting temperature is that of the intermetallic formed when the low temperature metal or alloy forms a new alloy with a high temperature melting point metal thereby creating an intermetallic having a higher melting point. TLPS materials form a metallurgical bond between the metal surfaces to be joined. Unlike tin/lead or lead (Pb) free solders, the TLPS do not spread as they form the intermetallic joint. Rework of the TLPS system is very difficult due to the high secondary reflow temperatures. Transient Liquid Phase Sintering is the terminology given to a process to describe the resulting metallurgical condition when two or more TLPS compatible materials are brought in contact with one another and raised to a temperature sufficient to melt the low temperature metal. To create a TLPS process or interconnect at least one of those metals is from a family of metals having a low melting point, such as tin (Sn) or indium (In), and the second metal is from a family having high melting points, such as copper (Cu) or silver (Ag). When Sn and Cu are brought together, and the temperature elevated, the Sn and Cu form CuSn intermetallics and the resulting melting point is higher than the melting point of the metal having a low melting point. In the case of In and Ag, when sufficient heat is applied to the In to cause it to melt it actually diffuses into the Ag creating a solid solution which in turn has a higher melting point than the In itself. TLPS will be used to generically reference the process and the TLPS compatible materials used to create a metallurgical bond between two or more TLPS compatible metals. TLPS provides an electrical and mechanical interconnect that can be formed at a relatively low temperature (<300 C) and having a secondary re-melt temperature >600 C. These temperatures are determined by the different combination of TLPS compatible metals. TLPS will be used to generically pertain to the process and materials used to create a TLPS metallurgical bond or interconnect.

TLPS bonds can be formed at relatively low initial process temperatures, as low as 157° C. Once the TLPS bond process is complete, the resulting joint has a much higher melting temperature than its initial process temperature, typically greater than 300° C., with a secondary melting above 450° C. being common for many material sets. TLPS differs from traditional solders in that solders are formed by melting two or more metals together to create an alloy having specific properties. These properties can be altered simply by adding additional metals to the alloy or by changing the % composition of the metals in the alloy. The solder alloy can then be remelted and solidified to join two or more surfaces. TLPS initially is not an alloyed material like that of solder alloys. TLPS is a metallurgical process based on the diffusion or sintering of two or more metals into one another and occurs specifically at the interface between two surfaces. Once a TLPS interface is created it cannot be re-melted at a low temperature. The higher re-melt temperature of TLPS, once the sintering or diffusion process has been completed, prohibits re-work of the assembly in many cases since these will sustain irreparable damage at these high temperatures. The TLPS process is achieved by bringing a low temperature melting metal, such as indium or tin, in contact with a high temperature melting metal, such as silver or copper, and elevating the temperature to a point where the low temperature metal melts and diffuses or sinters with the high melting temperature material. The rate of diffusion or sintering is a time temperature function and is different for the different combinations of metals. The result is a solid solution having a new melt temperature approaching that of the high temperature melting metal.

The TLPS technology is particularly suited to providing both a mechanical and electrical conductive metallurgical bond between two mating surfaces that are relatively flat. The metals typically used for the TLPS process are selected from two metal families. One consists of low melting temperature metals such as indium, tin, lead, antimony, bismuth, cadmium, zinc, gallium, tellurium, mercury, thallium, selenium, or polonium and a second family consist of high temperature melting metals such as silver, copper, aluminum, gold, platinum, palladium, beryllium, rhodium, nickel, cobalt, iron and molybdenum to create a diffused solid solution.

It is highly desirable to use a flux free process to eliminate any potential voids within the joint. Since TLPS is a sintering based process, the bond line is uniform and void free. Fluxes, which are necessary with solders, get entrapped in the joint and are subsequently burned out thus leaving a void. In the case with the semi-conductor industry, and specifically with die attach processes, these voids can create hot spots within the I/C which can lead to premature failure and reliability issues. TLPS addresses this issue since TLPS is a sintering process and free of fluxes. When the two metals are mated together and heat is applied, the lower melting metal diffuses into the higher melting metal to create a solid solution across the mating surface area. To create a solid uniform bond line it is mandatory that the mating surfaces be flat and coplanar to insure intimate contact across the entire mating surface. The required flatness of the mating surfaces also limits the application of this technology because there are many surfaces that are not sufficiently planar to yield a good joint.

A TLPS compatible metal particle core combined with a liquid carrier material to form a paste can be applied between two non-planar non-uniform surfaces having mixed surface preparation technologies such as plating, sintered thick film, and or plated sintered thick film and then heating to the melting temperature of the metal having the lowest melting point and holding that temperature for a sufficient amount of time to form a joint. A single metal particle core eliminates the need for multiple metals in a paste thus making the ratios of metals a non-issue. It is also possible to create a single particle by using silver, a metal having a high melting point of approximately 960° C. as a core particle, and then coating that particle with a metal shell having a low temperature metal such as indium having a melting point of 157° C. The advantage of using indium is that as it melts it diffuses into silver. If this bi-metal particle of silver and indium is placed between two surfaces each coated with silver, the indium will then diffuse into the silver surfaces as well as the silver core creating a solid solution joint. Other metals having a low melting point such as indium that could be considered for this bi-metal single particle include tin, antimony, bismuth, cadmium, zinc, gallium, tellurium, mercury, thallium, selenium, polonium or lead and metals having high melting points such as silver are, copper, aluminum, gold, platinum, palladium, beryllium, rhodium, nickel, cobalt, iron and molybdenum may also be considered as possible combinations.

Indium powder mixed with a flux and solvent to form a paste can be applied to produce a TLPS metallurgical bond between two coupons having a base metal of copper overplated with Ni and then overplated with about 5 microns (200μinches) of silver. The samples can be prepared by dispensing the indium paste onto a coupon having the plated surfaces as mentioned and then placing two coupons in contact with one another and heated to 150° C. for 5 seconds, followed by increasing the temperature to about 320° C. for about 60 seconds. The joint strength of the sample thus prepared can exhibit a pull weight in the range of 85-94 pounds equating to shear stress of 4,177 psi and a pull peel weight in the range of 5-9 pounds with an average of 7 pounds can be achieved. These results are comparable to results for SnPb solders having shear strengths of approximately 3000 psi and pull peel strengths in the 7-10 pounds range. One major difference is that the AgIn joint can withstand secondary melt temperatures exceeding 600° C. These results indicate that the In paste used to bond two silver plated coupons is at least equivalent if not stronger than current solder SnPb solders but also has a much higher secondary melt temperature thus yielding a material suitable for high temperature interconnect applications and also being lead free.

Methods to combine a lead frame to a structure generally consist of coating two mating surfaces one with a high temperature melting metal and its mating surface with a low temperature melting metal. The coating process may consist of vapor deposition or plating. A second method is to sandwich a preform film made from a low melting point metal or an alloy of two or more low melting point metals between two planar surfaces coated with a high melting point metal such as Ag, Cu, or Au. A third method is to create a paste consisting of particles of a high melting point metal such as copper and then adding particles of two alloyed low melting point metals such as Sn—Bi and mixed into a dual purpose liquid that cleans the surfaces to be bonded and also serves as the liquid ingredient to the metal particles to form a paste mixture.

If full diffusion of the two metals is not complete in the stated cycle time and the maximum secondary reflow temperature is not reached, the joint can be subjected to a second heating process. In this case the joint, or assembly, can be subjected to a temperature higher than that of the low melting point material and held for a period of time of from 15 minutes up to 2 hours. The time and temperature can be varied to provide a desirable secondary reflow temperature as dictated by secondary assembly processes or final environmental application requirements. In the case of the indium/silver TLPS, secondary melt temperatures in excess of 600° C. can be achieved.

A joint can be formed by subjecting the assembly to a temperature sufficient to melt the low temperature metal for a time sufficient to create a mechanical joint such as for 5 seconds to 30 seconds. Then during a secondary heating process, the joint is subjected to a temperature and time sufficient to allow the indium and silver to diffuse thereby creating an alloy having a higher secondary reflow temperature.

In addition to applying a paste to form a TLPS alloy joint between suitable surfaces this can also be achieved with a preform. In its simplest manifestation the preform can be a thin foil of the low temperature TLPS component. Alternatively, the preform can be produced by casting and drying the paste to remove the solvent. The resulting solid preform can be placed between the surfaces to be bonded. In this case it may be necessary to add a suitable binder to the paste for additional strength after drying. In all these cases the preform should be malleable such that it can conform to the surfaces to be bonded.

An interconnect comprising a single metal, such as indium, contained within a paste can be used to form a bond to a surface coated with a high melting point metal, such as silver. The diffusion of the indium into silver allows a lower temperature transient liquid phase to form that subsequently reacts to achieve a higher temperature bond. Achieving a high rate of diffusion in the lower melting point paste is critical to this bond formation. In order to achieve the desired properties in the final joint, such as reduced voids and a homogeneous phase the addition of other metals to the paste may be desirable. However, it is critical to retain the high diffusivity of the low melting point material. For this reason if one or more metals are required in addition to the low melting point metal it is preferred that these be incorporated by coating the metal powders prior to forming the paste. Coating the lowest melting point metal onto the higher melting point metal is preferred to retain an active surface. Coatings also have the desired effect of reducing the diffusion lengths between the different metallic elements of the paste allowing preferred phases to be more readily formed as opposed to a simple mixing of one or more additional metal powders to the single metal paste.

It is preferable that alloys be excluded. Alloys reduce the diffusion activity of the paste. The coated metal powders can preferably be formed using plating prior to incorporation within the paste.

Conductive adhesives are typically cross linking polymers filled with silver or gold particles that cure or cross link within a specified temperature range, generally 150° C., to form a mechanical bond to the materials to be joined. Their conductivity is created by the metal particles making intimate contact with one another, within the confines of the polymer matrix, to form an electrically conductive path from one particle to another. Because the binder is organic in nature, they have relatively low temperature capabilities, normally in the range of about 150° C. to about 300° C. Conductive epoxies, once cured, cannot be reworked. Unlike TLPS bonds, exposure to high heat or corrosive environments may decompose the polymeric bonds and oxidize the metal particles degrading the electrical properties. Both the electrical and mechanical performance of the interconnect can be compromised resulting in increased ESR and decreased mechanical strength.

Polymer solders may comprise conventional solder systems based on Pb/Sn alloy systems or lead free systems, such as Sn/Sb, which are combined with crosslinking polymers which serve as cleaning agents. The cross-linked polymers also have the ability to form a cross-linked polymer bond, such as an epoxy bond, that forms during the melting phase of the metals thereby forming a solder alloy and a mechanical polymeric bond. An advantage of polymer solders is that the polymeric bond provides additional mechanical bond strength at temperatures above the melting point of the solder, thus giving the solder joint a higher operating temperature in the range of about 5 to 80° C. above the melting point of the solder. Polymer solders combine current solder alloys with a cross linking polymer within the same paste to provide both a metallurgical bond and a mechanical bond when cured, such as by heating, to provide additional solder joint strength at elevated temperatures. However, the upper temperature limits and joint strength has been increased, just by the physical properties of the materials. A practical limit of 300° C. remains whereas the bonds created by TLPS can achieve higher temperatures.

A TLPS paste can form a termination on an electronic component that can subsequently be attached to an electronic circuit by other methods and/or materials. A metallurgical intermetallic bond is formed that can be lead (Pb) free which has improved joint strength compared to other material types such as Pb-free solder at elevated temperatures. The TLPS joint may be made directly with a buried electrode or electrodes within the component or through other materials in contact with these electrodes. The TLPS joint does not have to overlap the edge of the component.

The use of TLPS in paste form allows uneven surfaces to be joined. More specifically, the use of TLPS in paste form allows two irregular shaped surfaces to be joined with no intimate, or continuous, line of contact. This is particularly advantageous compared to plated surfaces that are subsequently diffusion bonded where the surfaces have to be in an intimate continuous line of contact during this process. This also allows electronic components of differing lengths to be combined within a stack or stacked within a lead frame. Since TLPS does not form solder balls, the stacked components can be placed on top of one another with the terminations in the same orientation with no gaps required for cleaning as needed in conventional attachment using solder.

Since the TLPS pastes do not flow like a conventional solder there is no need to employ solder dams on the lead frames. This feature provides a significant manufacturing convenience.

The TLPS paste can be used to form bonds between 2 or more components to each other or within a common lead frame. In the case of the lead frame, components of different lengths can be attached and there is no need for gaps between the components to clean solder balls since these do not occur. The resulting stacks are therefore thinner than if assembled with conventional solder. TLPS eliminates solder balls.

With TLPS paste thermo-compression bonding can be used to increase densities in the bond thereby forming more reliable joints than when relying on temperature alone. Both the mechanical properties and electrical properties are improved by thermo-compression bonding.

TLPS can be used to form a bond directly to the inner electrode of the electronic component. In MLCC's the inner electrode can be a high melting point metal. A low melting point metal can be coated on the edge of the MLCC and a high melting point metal layer, such as in a sheet or coupon, exterior thereto. Upon heating the low melting point metal can alloy with the internal electrode and the exterior metal thereby forming a metallurgical bond directly to the inner electrode.

It is particularly preferred that a low temperature be used to form an initial bond between the transient liquid phase sintering conductive adhesive and a component. Formation of the initial bond is followed by isothermal aging to generate a high temperature joint capable of sustaining higher temperatures. The reflow temperatures occur during attachment of the component to a circuit using a secondary attachment process and are less than the melt temperature of the highest melting element and the melt temperature of the alloy formed during the heating to form the initial bond. This is favorable compared to SAC type solder that requires a reflow of about 260° C.

A two-step reflow can also be used with the transient liquid phase sintering process wherein in the first step an electrically conductive metallurgical bond is formed at low temperature using a relatively short time cycle, in the range of 5 seconds to 5 minutes, and low temperature, in the range of 180° C. to 280° C., depending on the metals being used in the TLPS alloying process. In the second step the part is subjected to an isothermal aging process using a temperature range of 200° C. to 300° C. for a longer duration such as, but not limited to, 5 minutes to 60 minutes. The shorter times required to form the initial bond are well suited for an automated process. In another method a single step process can be used wherein the TLPS forms a terminal, or conductive metallurgical bond, between the external leads and electronic component(s) at temperatures of, for example, 250° C. to 325° C. for a duration of, for example, 10 seconds to 30 seconds. Lower temperatures, such as 175° C. to 210° C., can be used for a longer duration, such as 10 to 30 minutes. This is particularly useful when the electronic component itself is sensitive to temperature.

Typically, the terminations are formed, preferably by heating, using a one-step sintering process making an electrically conductive metallurgical bond at a temperature range of, but not limited to, 190° C. to 220° C., for a time of, but not limited to, 10 minutes to 30 minutes. It is most preferred that the second melt temperature exceed the first melt temperature by at least 80° C. The metallic bond can have a second melting temperature in excess of 450° C., thus making this technology a viable option for a low temperature processing lead (Pb) free solution suitable for use in subsequent high temperature applications. However, this type of process is more suited for batch type processes typical of semiconductor processing and some PCB processing but it is not conducive for high volume in-line termination and external lead attachment for electronic components including multi-layer ceramic capacitors. Furthermore, processing the TLPS this way can result in a high degree of porosity particularly with high levels of organic content.

TLPS materials can be processed using a two-step process to achieve favorable interconnected joints. The first step forms a robust electrically conductive metallurgical joint in a relatively short process time of 30 seconds or less at a temperature in the range of 225° C. to 300° C. The second step is a sintering step that subjects the parts to a temperature of 200° C. to 250° C., or less, for a time of 5 minutes to 30 minutes to complete the alloying process. The two-step process is satisfactory for high volume in-line assembly where a subsequent batch sintering process is acceptable. However, as with the aforementioned single step process the porosity is often undesirably high.

In many applications a high degree of porosity may be acceptable. However, in harsh environments, such a high humidity or in circuit board mounting processes, high porosity is not desirable since water or other chemicals may penetrate through the bond which may cause the component to fail. A preferred embodiment of this invention is therefore to form a low porosity termination within the transient liquid phase sintering joint using a thermo-compression bonding process. This process has the added advantage of using a low process time of 15 to 30 seconds at a temperature in the range of 225° C. to 300° C. in a single step making it suitable for automation. Robust joints can be created for the application of attaching external leads to MLCC's, when leads are used, with a one-step low temperature in less than 30 seconds and in combination with thermo-compression bonding.

Thermo compression bonding is also a preferred processing method when using polymer solder because it assists in the formation of a high-density metallurgical bond between the contacting surfaces. The advantages of thermo-compression include a more robust bond with respect to secondary attachment processes and attachments with higher strength are achieved. A compressive force of 0.5 to 4.5 Kilograms/cm2 (7.1 to 64 psi) and more preferably 0.6 to 0.8 Kilograms/cm 2 (8.5 to 11 psi) is sufficient for demonstration of the thermo-compression teachings herein. About 0.63 Kilograms/cm2 (9 psi) is a particularly suitable pressure for demonstration of the teachings.

TLPS comprise high temperature materials selected from copper, silver, aluminum, gold, platinum, palladium, beryllium, rhodium, nickel, cobalt, iron and molybdenum or a mixture or any combination thereof are suitable for use in the TLPS process. The lead(Pb) free TLPS materials preferably use either silver or copper as the high temperature component and indium, tin, or bismuth as the low temperature component.

TLPS further comprises low temperature materials selected from tin, antimony, bismuth, cadmium, zinc, gallium, indium, tellurium, mercury, thallium, selenium, or polonium, or a mixture or an alloy of any two or more of these.

The TLPS materials are compatible with surface finishes containing silver, tin, gold, copper, platinum, palladium, nickel, or combinations thereof, either as lead frame finishes, component connections or inner electrodes to form an electronically conductive metallurgical bond between two surfaces. Suitable external lead or lead frame materials include phosphor bronze, copper, alloys of copper such as but not limited to beryllium copper, Cu194 and Cu192, as well as lead frames consisting of ferrous alloys such as but not limited to Alloy 42 and Kovar.

Heating can be done by any method known in the art with convection heating, radiant heating and induction heating being most preferred.

The invention will be described with reference to the figures forming an integral, non-limiting, component of the disclosure. Throughout the various figures similar elements will be numbered accordingly.

An embodiment of the invention will be described with reference to the schematic cross-sectional side view in FIG. 1. In FIG. 1, electronic components, 1, such as an MLCC's, comprise external terminations, 2, which are in integral electrical contact with the internal electrodes through a TLPS bond as will be more readily understood from further discussions. A particular advantage is the ability to bond at least on, and preferably a stack of MLCC's, with a TLPS bonded external termination in electrical contact with each end thereby forming a leadless mounted MLCC, or stack of leadless MLCC's, that can be attached to contact pads, 4, on an electronic circuit board substrate, 5, using a secondary attachment material, 3, such as a solder fillet. It can be seen that in this way electronic components with many terminations formed with TLPS can be attached to a circuit without a lead either individually or in a stack. However, the higher secondary melting temperature of the TLPS joint makes TLPS preferred over the polymer solder since this allows a wider range of secondary attachment materials to be considered. Element 1A may be an additional electronic component as described above or in the case of a leadless stack this may represent a sacrificial chip which absorbs flexure. The sacrificial chip is preferably sufficiently large to absorb flexure but no larger than necessary. A sacrificial chip with a thickness of 35-60 thousands of an inch is sufficient.

A leadless stack of MLCC's suitable for use in the instant invention is illustrated in schematic cross-sectional side schematic view in FIG. 2. In FIG. 2 the leadless stack is formed by applying and reacting a suitable TLPS paste or preform, 18, between external terminations, 7, on adjacent MLCC's. The preform, as described herein, is preferably malleable thereby allowing the preform to conform to the adjacent surfaces. When heated the low melting metal of the preform diffuses into the external terminations thereby forming a metallurgical bond. The preform may also contain a high melting point metal, preferable the same metal as in the external termination, and when heated the low melting point metal diffuses into the high melting point metal of the preform thereby forming a metallurgical bond between the high melting point metal of the preform and the external termination to insure adequate electrical conductivity between the external terminations of adjacent MLCC's. The external terminations can be formed by co-firing a thick film paste, or by curing a conductive adhesive, thereby forming an electrical contact with the inner electrodes, 9 and 10. A dielectric, 11, separates the inner electrodes.

The external termination may comprise multiple layers to facilitate TLPS bonding. An embodiment of the invention is illustrated in schematic cross-sectional view in FIG. 3. In FIG. 3, the external termination comprises multiple layers with the first layer, 7', being in direct contact with the internal electrodes, 9 and 10, of the MLCC and a termination layer, 7, being compatible with the preform, 18, and capable of forming a TLPS bond therewith. Either a solder layer or plated layer, 26, can be provided which encases the termination layer and preform to facilitate secondary attachment to the circuit board and specifically to improve solderability and a compliant non-metallic can be incorporated as discussed elsewhere herein.

In the inventive examples described herein the TLPS joint serves as both an electrical and mechanical bond. The electrical bonds in the prior art have limited capability in the case of conductive adhesives because of the decomposition temperatures of the polymers, which are typically epoxy. It is usually not possible to use solders to combine MLCCs alone within a leadless stack since these are prone to reflow compromising the electrical and/or the mechanical integrity of the stack during the secondary attachment to the circuit board. The use of leads in the prior art to overcome mechanical failures through board flexure or by reducing CTE mismatch is limited due to the weakening of the interconnects used during thermal excursions. Combinations of lead materials and MLCC types to reduce these stress issues for reliable performance have been developed but these result in other limitations. For example, Alloy 42 has been used to reduce CTE mismatch but the result is an undesirably higher ESR for the resulting stack. The leadless stacks manufactured using TLPS to bond MLCC with fired and plated terminations have a high resistance to board flexure cracks wherein the performance is no worse than the performance of individual capacitors thus confirming the robustness of the inventive joint with respect to their mechanical performance. Since TLPS can form a continuous highly conductive metallurgical interconnect layer between the MLCC's this can achieve lower ESR than aforementioned leaded stacks made with alloy 42 leads. Since the leadless stacks do not require the stand-off associated with a stack the same number and type of MLCC can be formed in shorter stacks. Shorter stacks combined with the relatively low formation temperature of the TLPS bond allows other components and additional circuits to be added to the stack. In cases where the leadless stacks are used in very mechanically demanding applications a mechanical absorption component with no electrical functionality can be added to the bottom of the stack.

The use of the TLPS termination to form a conductive bond to an external lead is shown in FIG. 4 wherein the electronic component, 1, is connected to an external lead or lead frame, 6, preferably with a TLPS, 8, between the external lead frame and external termination, 7.

In FIG. 5, TLPS external terminals, 12, are in direct contact with the inner electrodes, 9 and 10, of a multi-layer ceramic capacitor. The interleaved planer inner electrodes of alternating polarity are separated by a dielectric, 11, and alternating inner electrodes are in direct contact with opposing external terminations, 12, formed by the TLPS. This embodiment provides the additional benefit of avoiding the processing costs associated with forming other connecting materials on the electronic component. With TLPS external terminations the embodiment of FIG. 5 can then be stacked with similar embodiments with a TLPS bond forming a unified external termination thereby providing a lead-less stack of MLCC's are illustrated in FIG. 1.

An embodiment of the invention is illustrated in exploded cross-sectional schematic exploded view in FIG. 6. In FIG. 6, MLCC monolith's comprising alternating layers of inner electrodes, 9 and 10, separated by a dielectric, 11, are illustrated wherein adjacent internal electrodes terminate at opposite ends. In one embodiment the internal electrodes are the high melting metal of the TLPS bond. A preform, 302, is applied to the edge of the monolith to form an external termination. The preform comprises a core which may be a layered structure, with a high melting metal, 303, at the interface with a low melting metal, 304. The MLCC's are stacked and the preform attached to the MLCC's wherein the low melting metal, 304, diffuses into the internal electrodes and into the high melting metal, 303, thereby forming a metallurgical bond between the preform and internal electrodes of each MLCC. The high melting metal of the preform may form a lead frame. In another embodiment the low melting metal may be on the MLCC.

During the formation of the TLPS bonds the diffusion of the low melting point metal depends on its reactivity as well as the time and temperature of the bond formation process. To achieve a high reactivity it is desirable to avoid alloys but the respective metals and their thicknesses should be chosen to prohibit the possibility of secondary phase formation with reference to the respective phase diagrams.

An embodiment with a single MLCC is illustrated in FIG. 7. In FIG. 7 TLPS terminations, 14, bond an external lead, 15, to the inner electrodes, 9 and 10, and do not extend past the edge, 17, of the multi-layer ceramic capacitor body, 16. This embodiment reduces the failures that occur at this overlap area since the mechanical stresses are eliminated.

Figure 8:
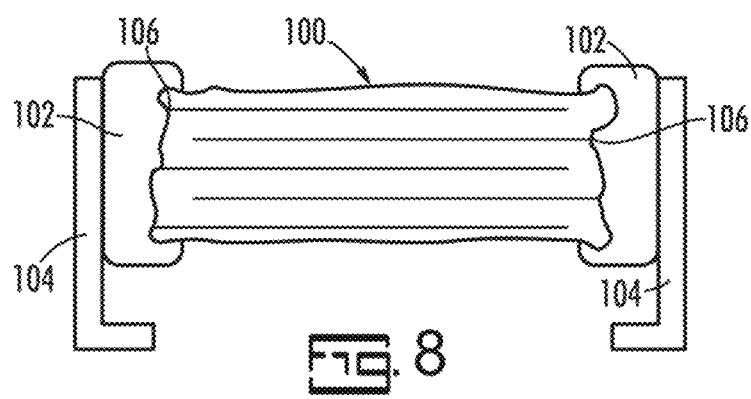
FIG. 8 is a side cross-sectional schematic view of an embodiment of the invention.

In FIG. 8 a cross-section of an electronic component is shown, in this case a multi-layer ceramic capacitor, 100, with TLPS terminations, 102, contacts through a conductive interconnect to external leads, 104. The edge, 106, has no continuous intimate line of contact between the conductive connection and the external leads. A particular advantage is that the two surfaces of the external lead and conductive interconnect when mated together are not required to form a continuous line of intimate contact.

Figure 9:
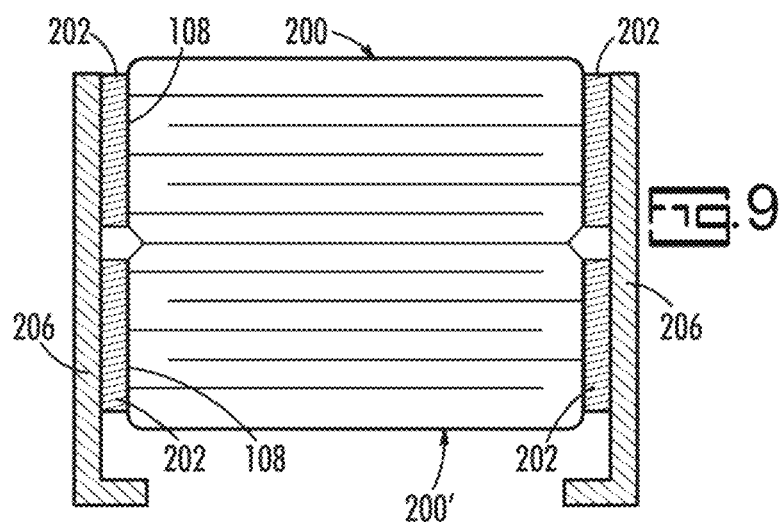
FIG. 9 is a side cross-sectional schematic view of an embodiment of the invention.

An embodiment of the invention is illustrated in FIG. 9. In FIG. 9, two MLCC's, 200 and 200', between lead frames, 206, are illustrated for the purposes of discussion with the understanding that many could be stacked. Each MLCC has TLPS terminations, 202, which cover only a portion of the edges, 108, of the MLCC. This allows the MLCC's to be closely spaced with a minimum, or no gap, between the faces of the MLCC. The TLPS terminations, 202, can be preformed as a mixture or layered structure and inserted between the components followed by a single heating step or multiple heating steps. Alternatively, an external termination can be formed in direct electrical contact with the internal electrodes.

Diffusion driven bonding processes have been successfully used between flat surfaces, such as those found in die attachment, however there are applications where creating such flat surfaces is not practical. In these cases, there is a need for a high temperature solution that can accommodate the joining of non-uniform mating surfaces having the capability to fill gaps and voids between the mating surfaces to be joined. Metals commonly used for TLPS technology are chosen from two metal families. One family consists of metals having a low melting point and the second family consists of metals having a high melting point. When a member of the low temperature family is brought into contact with a member of the high temperature family and exposed to heat, the lower melting point metal diffuses or sinters into the high temperature melting point metal creating an alloy having a melting point less than that of the high temperature material. This process referred to as Transient Liquid Phase Sintering (TLPS) makes it possible to create interconnects at relatively low temperatures but yet have high secondary reflow temperatures lower than that of the high melting point metal, due to the formation of the TLPS solid solution.

Figure 10:
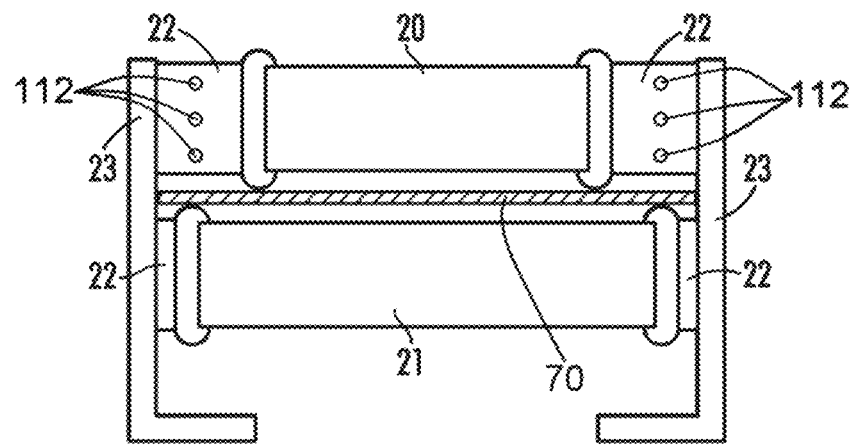
FIG. 10 is a cross-sectional schematic view of an embodiment of the invention.

An embodiment of the invention is illustrated in FIG. 10 as a schematic side view of stacked MLCC's wherein the two MLCC's, 20 and 21, have different widths. The TLPS terminations, 22, can accommodate electronic components of differing lengths with adequate contact to the external leads, 23. In this way, components of differing lengths up to 2.54 mm (0.10 inches) can be attached within the same stack even though it is preferable that the lengths differ by no more than 0.254 mm (0.010 inches). It is often desirable to join multiple non-uniform surfaces, having a mixed technology of surface metals such as plated silver, sintered silver or other combinations TLPS compatible metals. As illustrated in FIG. 10, one surface to be joined can be electroplated, such as with silver, and the mating surface can be covered with a thick film silver paste then sintered. A single component low temperature metal such as indium, such as in a paste form, can then be deposited between the two surfaces that are to be joined each having a silver coating or other compatible TLPS high temperature metal. The paste has the capability to fill the gaps between the non-uniform surfaces of different sized MLCC's. The assembly is then heated to the melting point of indium such as at 157° C. or another suitable low temperature material other than indium and held at the liquidous temperature for a period of time from 5 seconds to 15 minutes, cooled, and then allowed to solidify. The resulting joint interconnect material will have a secondary reflow temperature greater than the temperature of the low temperature material. An optional insulator layer, 70, between adjacent MLCC's in a stack provides protection against arcing between external leads. An insulator layer is more preferable for higher voltage applications, such as above 200 volts, or above 250 volts. The insulator layer can be provided by a variety of polymeric conformal coatings based on various chemical families which can include acrylic, polyurethane, polyimide, epoxy, parylene (paraxylylene) and silicone. The TLPS terminations may comprise inert fillers, 112.

The TLPS paste or preform may have inert fillers therein to serve two purposes. One purpose is to minimize the cost due to expensive metals and the second purpose is to make direct electrical and metallurgical bonds directly to the non-terminated ends of the MLCC and exposed internal electrodes. The cost can be reduced, particularly, when a gap is to be filled as discussed relative to FIG. 10 by replacing a portion of, particularly, the high melting metal component with an inert material or with a lower cost conductive material. Particularly preferred fillers for use in place of the high melting point metal are non-metals such as ceramics with melting points >300° C. and glasses or high temperature polymers with glass transition temperatures ($T_g$) >200° C. An example would be a thermosetting polymers such as polyimide. Two particular advantages of replacing the high melting point metal with one of these non-metals is that the active low melting point metal of the TLPS with not be consumed by diffusion during the TLPS bond formation. The second advantage of inert fillers when selected from a family of glasses having low melting points is that the glass within the mixture of the TLPS paste or preform will create a bond with the exposed glass frit of the non-terminated and exposed ceramic body of the MLCC. The non-metals can also be coated with the low melting point metal by methods such a spraying or plating.

Figure 11:
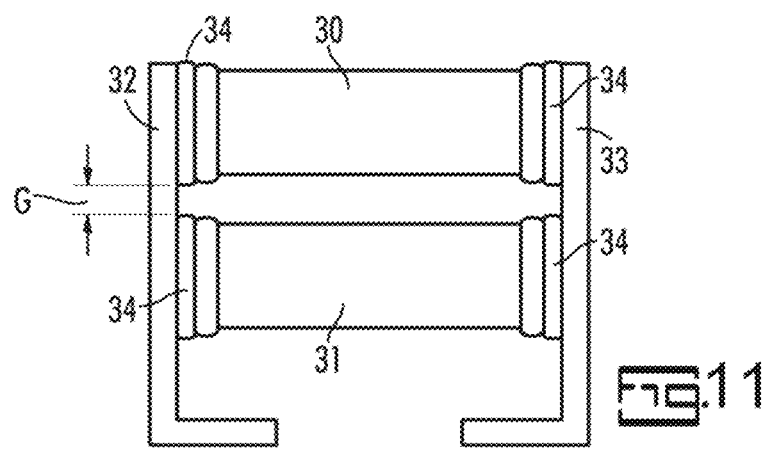
FIG. 11 is a side schematic view of stacked MLCC's.

FIG. 11 illustrates a side schematic view of a stack of two components, 30 and 31, attached to external leads 32 and 33 using a conventional solder 34. In this case a gap, G, of at least 0.254 mm (0.010") can be required between the components to allow for post assembly cleaning for removal of solder balls.

Figure 12:
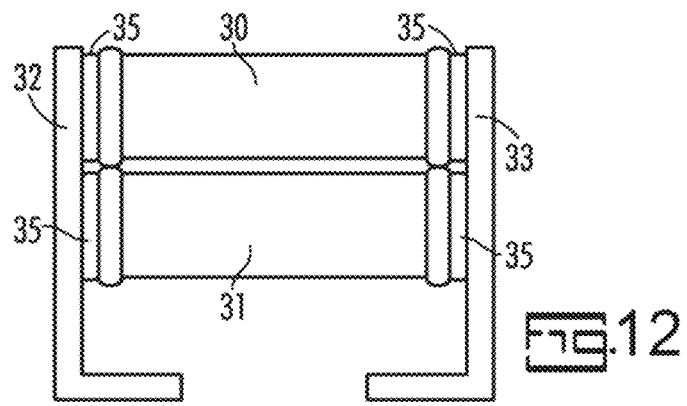
FIG. 12 is a side schematic view of an embodiment of the invention.

FIG. 12 illustrates, in cross-sectional side schematic view, an embodiment of this invention with a stack of two components, 30 and 31, attached to external leads, 32 and 33, using a TLPS, 35. In this case a gap of less than 0.254 mm, and preferably no gap, can be used between the components since no solder balls are formed and therefore cleaning is not required. Elimination of the gap allows an overall reduction in height of the stack thereby reducing the vertical space required for the electronic components. Furthermore, for stacks of more than two components the savings in space will be even greater.

It is highly desirable to create a joint with minimum porosity that exhibits the following characteristics: strong mechanical strength in excess of 5 Lbs./inch for Pull Peel test, Tensile, and Shear high electrical conductivity, low initial process temperature in the range of 150° C. to 225° C., a secondary reflow temperature in excess of 300° C. or higher, between non uniform surfaces making intimate contact or having gaps up to 0.015 inches.

Figure 28:
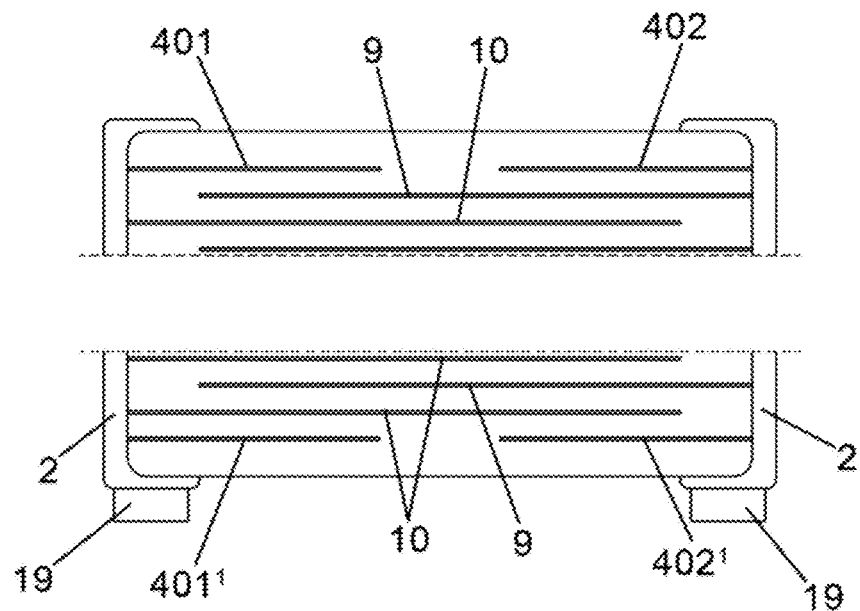
FIG. 28 is a schematic cross-sectional view of an embodiment of the invention.

Representative MLCC structures suitable for use with microphonic noise reduction structures as described herein are illustrated in schematic cross-sectional view in FIGS. 28-31 wherein the MLCC further comprises a microphonic noise reduction structure, 19, such as a compliant non-metallic layer or shock absorbing conductor as described elsewhere herein. In FIG. 28, inner electrodes, 9 and 10, of opposite polarity terminate at opposite external terminations, 2. Co-planer conductors, 401 and 402, are provided which terminate at opposite external terminations. As illustrated the upper conductor 401 provides some capacitive overlap as well as shielding with respect to the adjacent internal electrode of opposite polarity but the lower conductor, 401', is of the same polarity as the adjacent electrode, which is commonly terminated, and therefore lower conductor 401' does not function as a shield electrode. Upper conductor 402 is of the same polarity as the adjacent electrode, which is commonly terminated, and therefore conductor 402 does not function as a shield electrode whereas the lower shield electrode 402' does provide some capacitive overlap with the adjacent internal electrode of opposite polarity. For the purposes of the instant invention a shield electrode is defined as a conductor on the outermost layer which provides a capacitive couple as represented by conductors 401 and 402' of FIG. 28.

Figure 29:
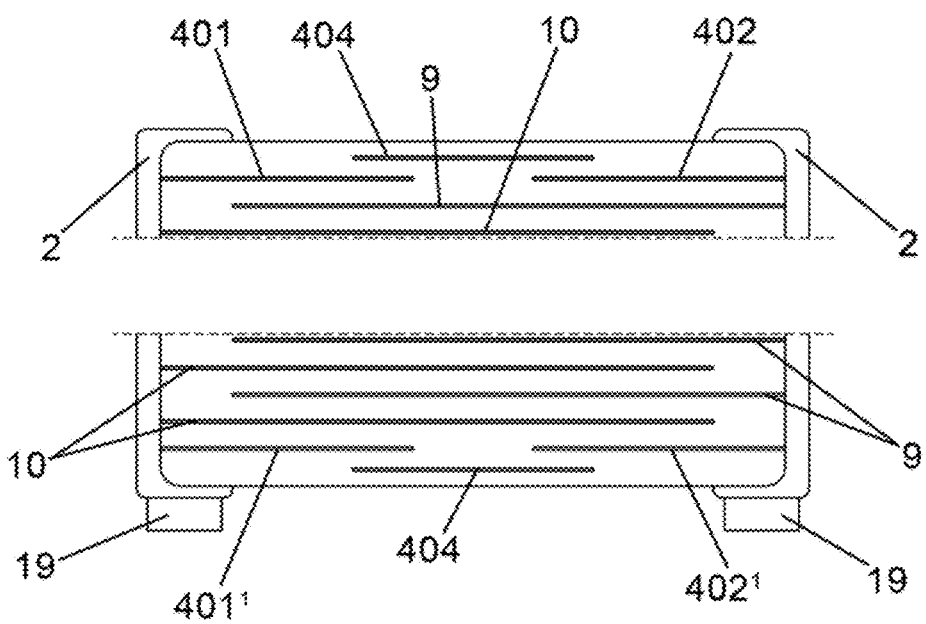
FIG. 29 is a schematic cross-sectional view of an embodiment of the invention.

An embodiment of an MLCC is provided in cross-sectional schematic view in FIG. 29 wherein the capacitive structure of FIG. 28 has an additional conductor which is a floating conductor, 404, parallel to, but outside of the main conductive layers presented by the assembly of internal conductors 9 and 10 and coplanar electrodes 401 and 402. For the purposes of the instant invention floating electrodes wherein all internal conductors are interior to the floating electrodes will be referred to as external floating electrodes. For the purposes of the instant invention a floating electrode is a conductor which is not terminated.

Figure 30:
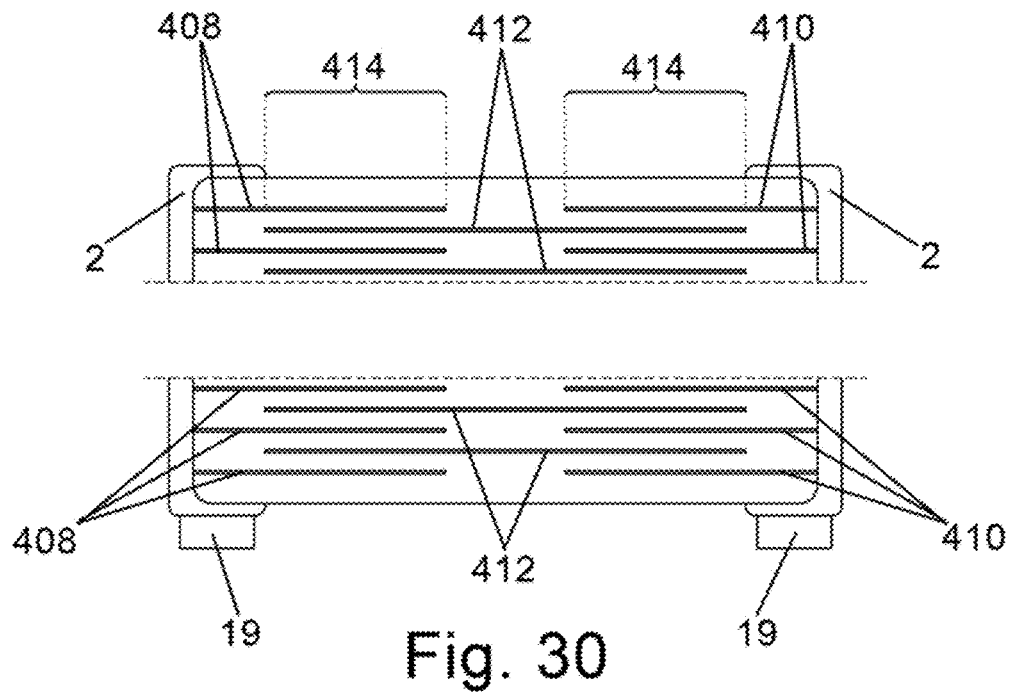
FIG. 30 is a schematic cross-sectional view of an embodiment of the invention.

An embodiment of an MLCC is provided in cross-sectional schematic view in FIG. 30. In FIG. 30, coplanar internal electrodes 408 and 410 terminate at opposite external terminations, 2, and therefore the coplanar internal electrodes are of opposing polarity. Internal floating electrodes, 412, between adjacent layers of coplanar internal electrodes provide capacitive overlap areas, 414. For the purposes of the instant invention floating electrodes, wherein at least one internal conductors is exterior to the floating electrodes, will be referred to as an internal floating electrode. As illustrated, FIG. 30 has two capacitive overlap areas. As would be realized to those of skill in the art, the floating electrodes form the opposed electrodes with respect to the electrodes contacting the terminations so achieving 2 capacitor overlap areas in series.

Figure 31:
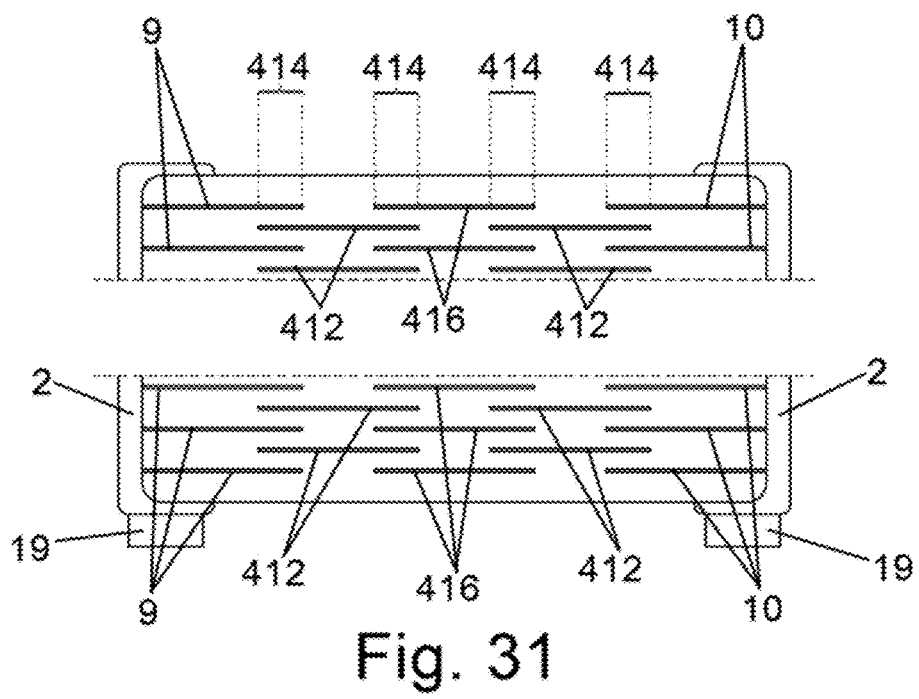
FIG. 31 is a schematic cross-sectional view of an embodiment of the invention.

An embodiment of an MLCC is provided in cross-sectional schematic view in FIG. 31. In FIG. 31, an active plane comprises coplanar floating electrodes, 416, which are coplanar with terminated internal electrodes, 9 and 10. The internal electrodes are terminated at external terminations, 2, but the coplanar floating electrodes are not themselves terminated. Coplaner internal floating electrodes, 412, between adjacent active planes provide a multiplicity of capacitor overlap regions, 414.

Figure 32:
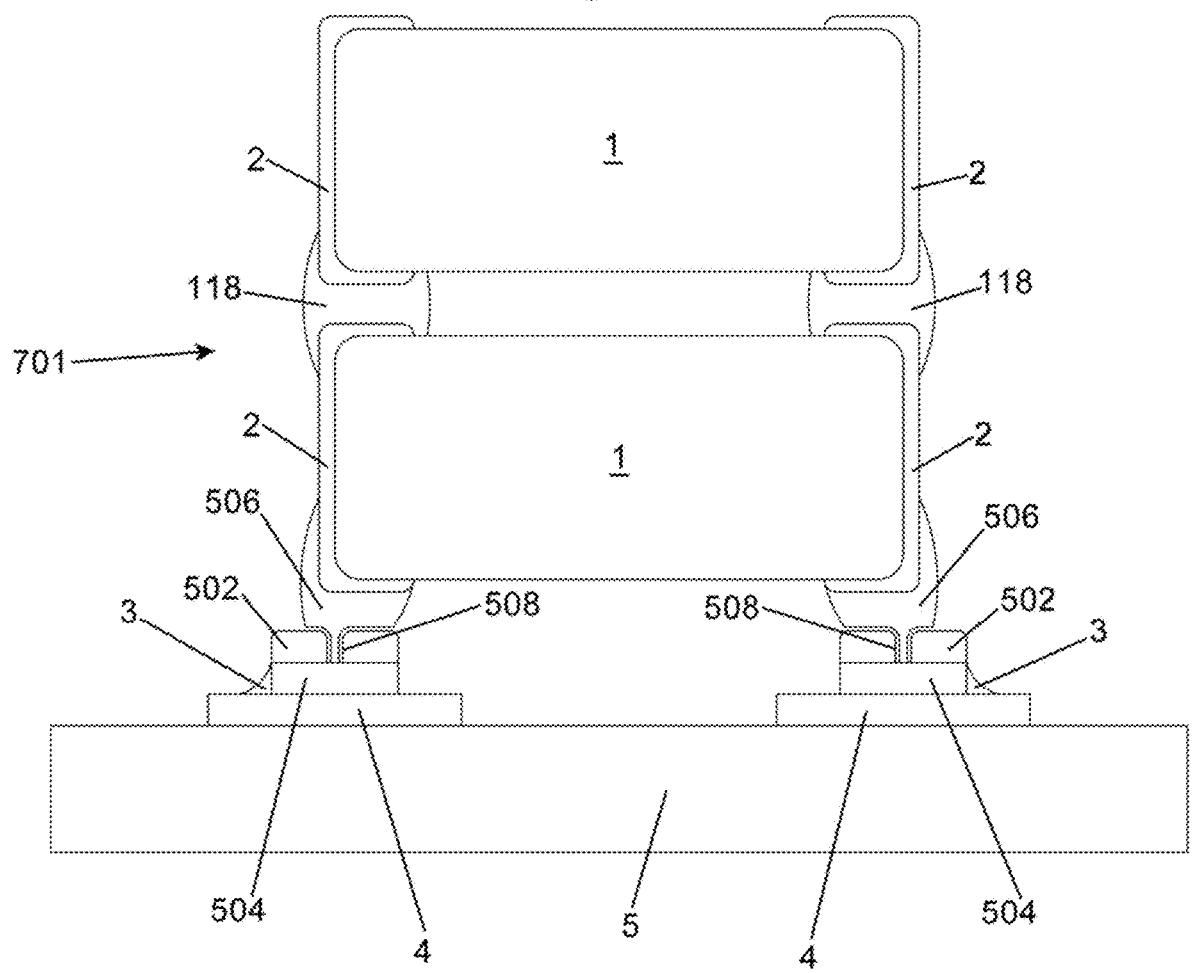
FIG. 32 is a schematic side view of an embodiment of the invention.

A portion of an electronic device, 701, of the invention is provided in schematic side view in FIG. 32. In FIG. 32, a microphonic noise reduction structure is provided comprising a compliant non-metallic layer, 502, laminated to a conductive metal layer, 504. The external termination, 2, of the electronic component, 1, which is preferably an MLCC, is in electrical contact with the conductive metal layer, 504, by a TLPS interconnect, 506, extending through a gap in the form of a via, 508, of the compliant non-metallic layer, 502. Optionally, additional electronic components may be stacked on the lowermost electronic component and connected by a TLPS interconnect, 118, such as a preform as discussed elsewhere herein. The conductive metal layer is electrically and mechanically secured to contact pads, 4, on an electronic circuit board substrate, 5, by a secondary attachment material, 3, such as a solder fillet. While not limited to theory, it is hypothesized that the mechanical energy that causes microphonic noise is reduced by reduced transmission of vibrational energy through the compliant non-metallic layer and through the reduced size of the solder fillet since the compliant non-metallic layer is not wet by solder. The compliant non-metallic layer can be quite thin with the lower limit being defined by manufacturability with layers which are too thin being difficult to handle in large scale manufacturing environments. A compliant non-metallic layer with a thickness of at least 25.4 µm (0.0001 inches) and more preferably at least 0.0254 mm (0.001 inches) to no more than 1.575 mm (0.062 inches) thick and preferably no more than 0.381 mm (0.015 inches) thick is adequate for demonstration of the invention.

Figure 33:
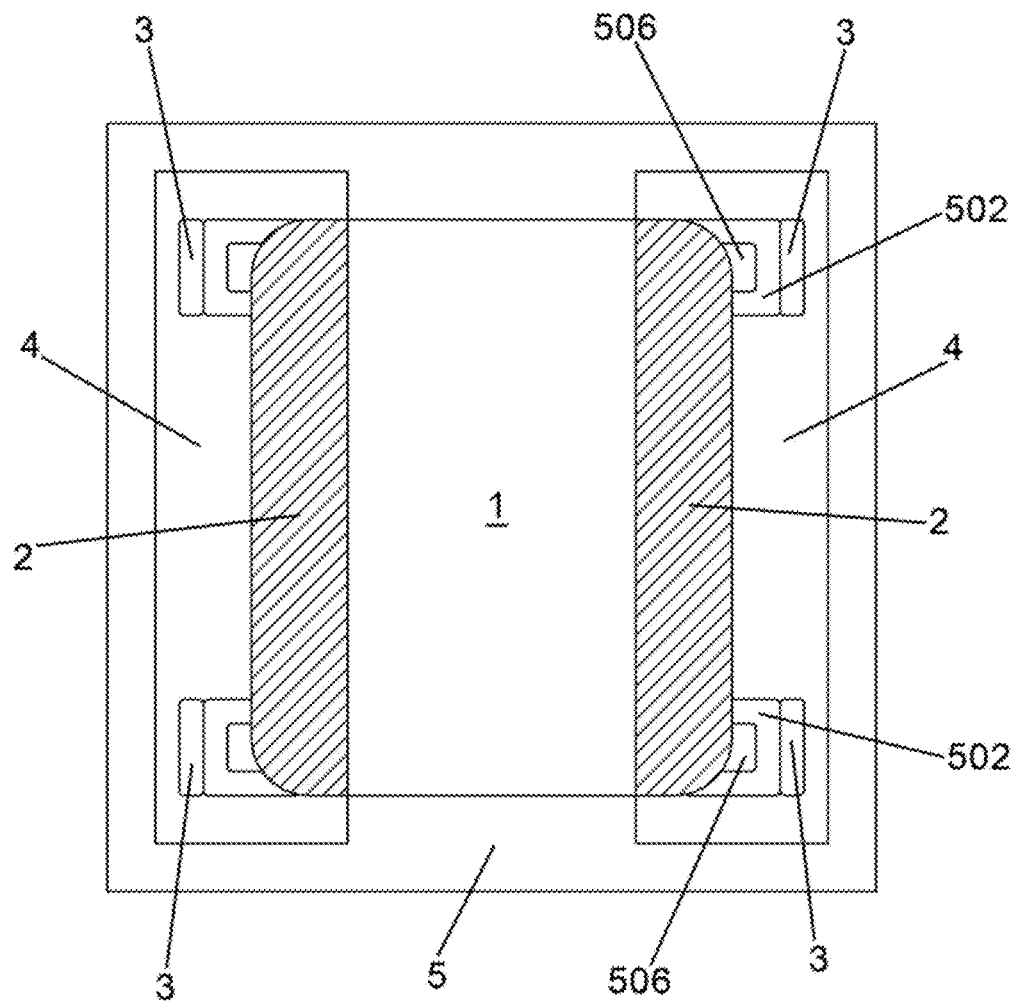
FIG. 33 is a schematic top view of an embodiment of the invention.

An embodiment of the invention is illustrated in schematic top view in FIG. 33. In FIG. 33, the electronic component, 1, or stack of electronic components, is attached by more than one microphonic noise reduction structure, preferably at the corners of the external termination, 2, thereby providing multiple electrical and mechanical connections to the contact pads, 4, on an electronic circuit board substrate, 5, by a secondary attachment material, 3, such as a solder fillet. By using more than one structure per terminal the total solder fillet attachment area can be further reduced and the structures can be positioned in such a way as to minimize microphonic noise.

Figure 34:
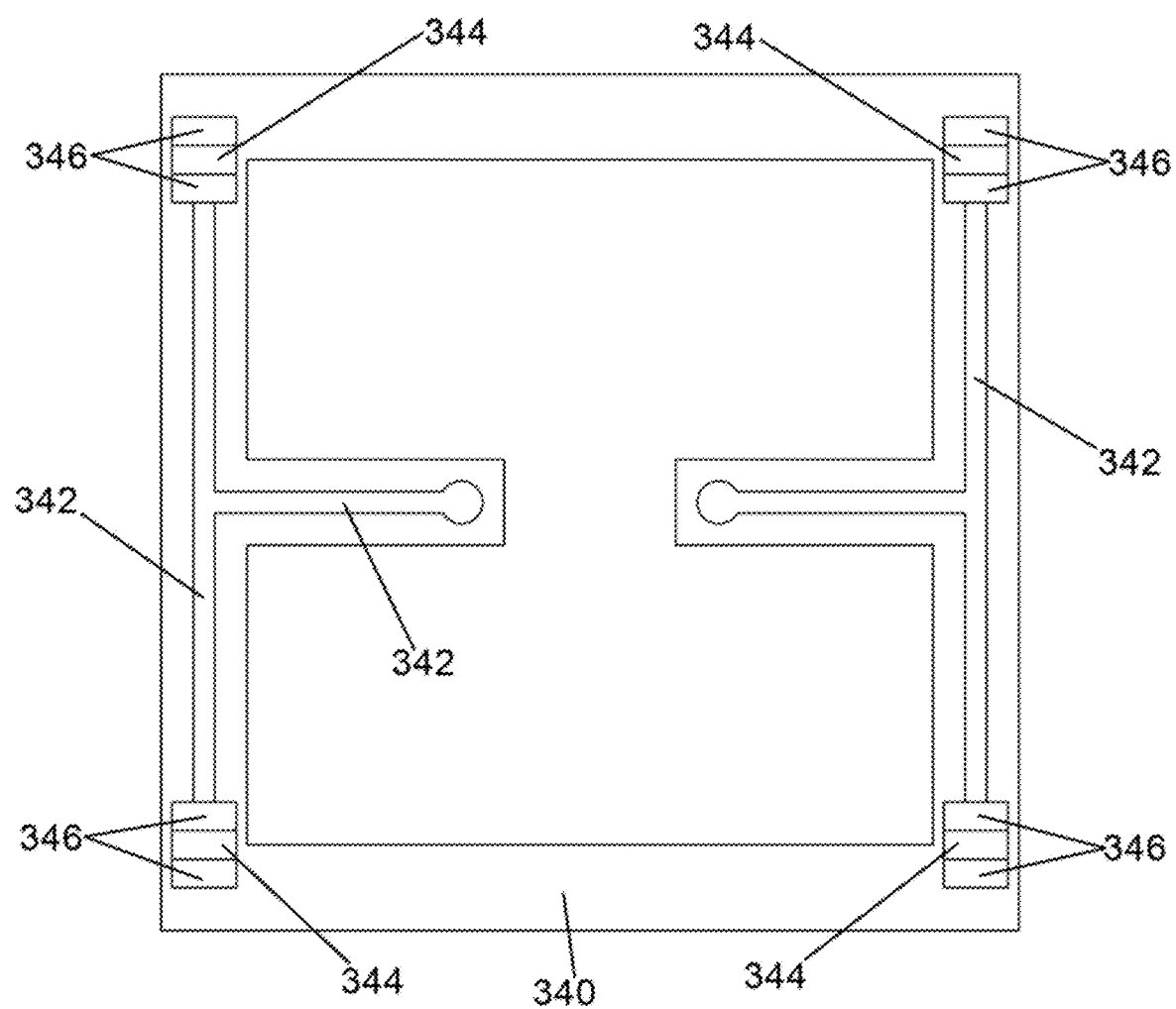
FIG. 34 is a schematic top view of an embodiment of the invention.
Figure 35:
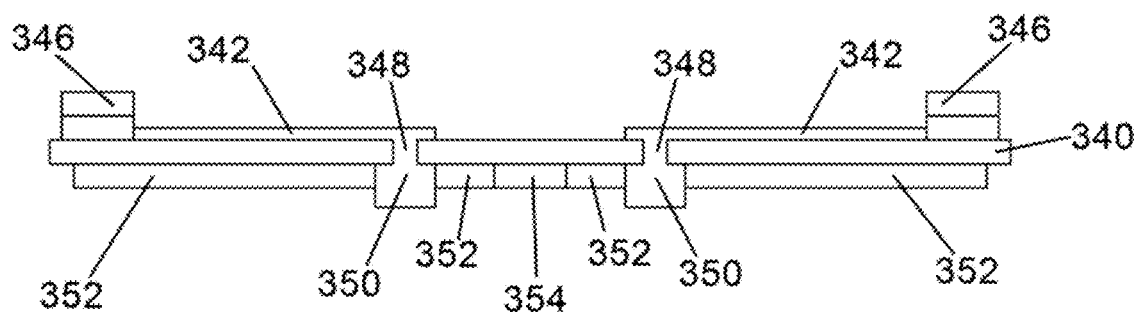
FIG. 35 is a schematic side view of an embodiment of the invention.
Figure 36:
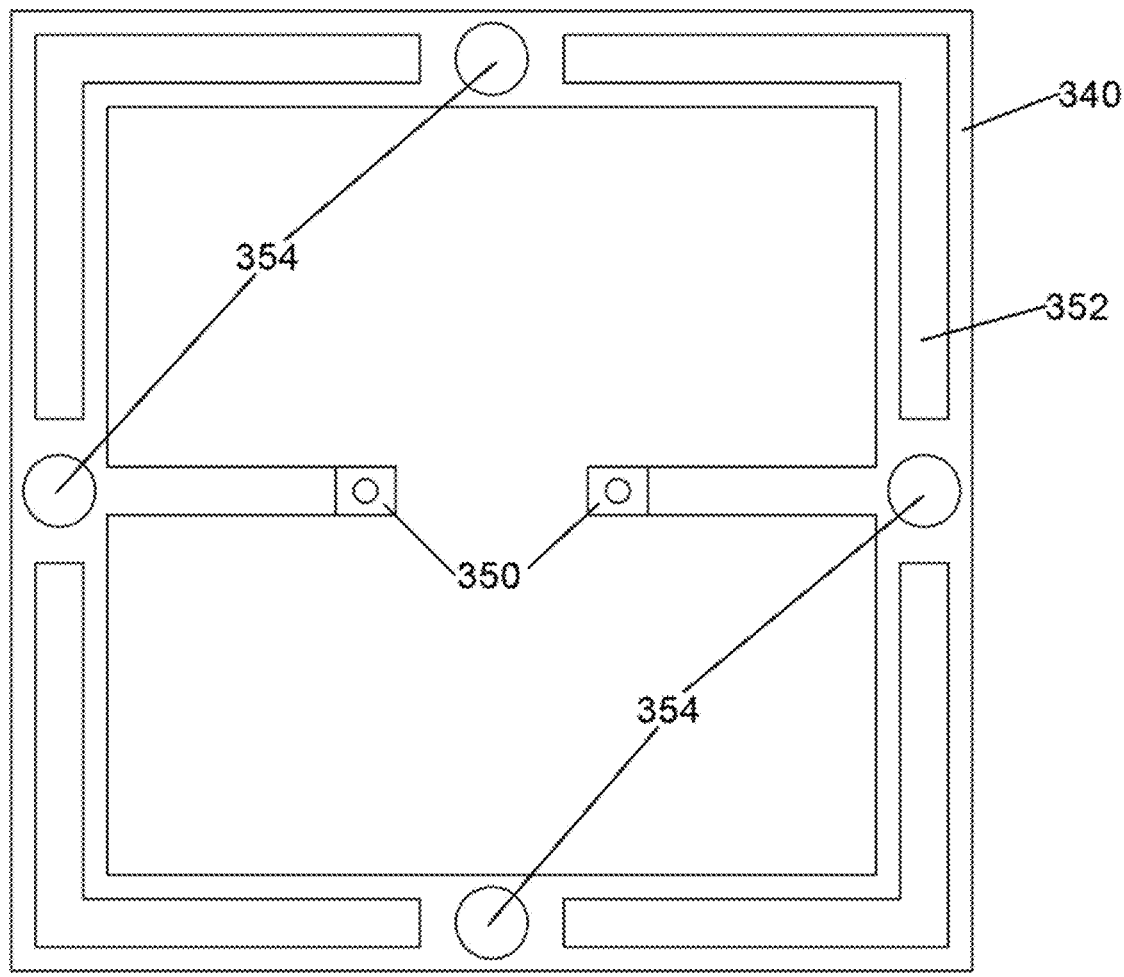
FIG. 36 is a schematic bottom view of an embodiment of the invention.

An embodiment of a microphonic noise reduction structure made from typical circuit board materials is illustrated in schematic top view in FIG. 34, schematic side view in FIG. 35 and schematic bottom view in FIG. 36. In FIGS. 34-36, the microphonic noise reduction structure comprises a circuit board substrate, 340, manufactured from standard circuit board material such as FR4, perflouroelastomers, polyimide, kapton, peek, electronic grade ceramics, such as yttrium stabilized zirconia or $Al_2O_3$ (alumina oxide), and the like. Conductive traces, 342, electrically connect solder pads, 344, to which the electronic components will be electrically attached as described relative to FIGS. 32 and 33. A solder mask, 346, as a compliant non-metallic layer, on the solder pads, 344, comprises a gap there between thereby limiting the surface area available for electrical and mechanical attachment of the external termination of the electronic component to the solder pad. Vias, 348, through the circuit board substrate allow electrical conductivity of electrical contact solder pads, 350, on the opposite side of the circuit board relative to the electronic component. A vibration absorbing elastomer, 352, inhibits transfer of any vibration thereby isolating any microphonic noise to the microphonic noise reduction structure. Optional mechanical solder pads, 354, can be included to insure adequate adhesion when the microphonic noise reduction structure is attached to a subsequent board of an electronic device. The mechanical mounting pads can be located so as not be directly beneath the electrical contact pads connecting the electronic component of the microphonic noise reduction structure. The conductive traces and solder pads are separated by a sufficient distance to avoid arcing there between.

Figure 37:
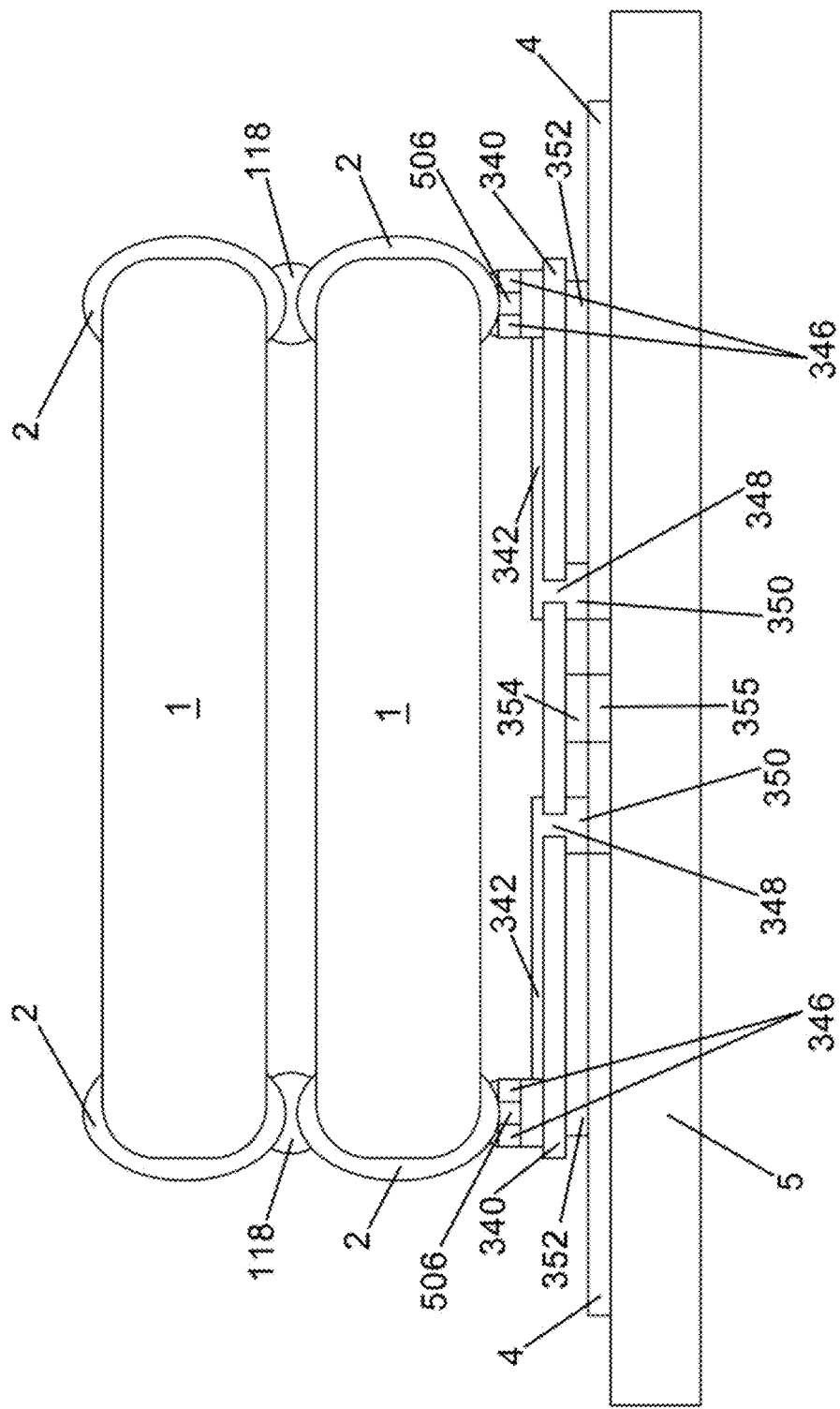
FIG. 37 is a schematic side view of an embodiment of the invention.

An embodiment of the invention is illustrated in side schematic view in FIG. 37 wherein the microphonic noise reduction structure illustrated in, and described relative to, FIGS. 34-36, comprises at least one electronic component, 1, mounted thereon, preferably with TLPS, adhering the external termination to the solder pad, 344, with the solder mask, 346, there between. The solder pads, 350, are in electrical contact with the contact pads, 4, on an electronic circuit board substrate, 5. The optional mechanical solder pads, 354, can be mechanically attached to dummy traces, 355, which are not necessarily conductive or otherwise electrically connected.

Figure 40:
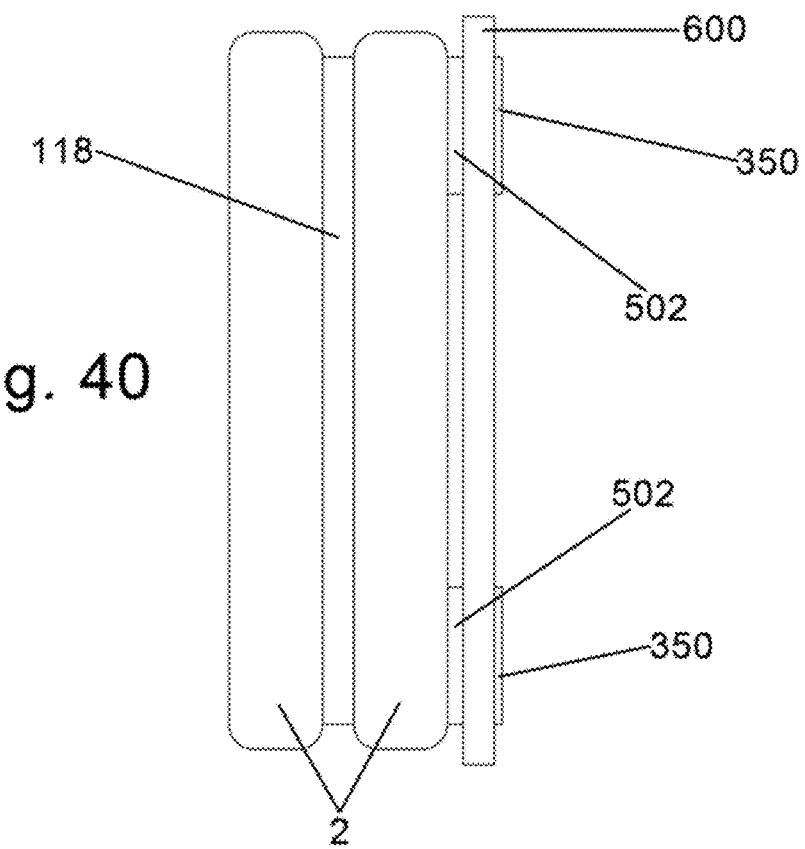
FIG. 40 is a schematic side view of an embodiment of the invention.

An embodiment of the invention will be described with reference to FIGS. 38-40 wherein microphonic noise reduction structures, in the form of isolation pads, are illustrated with two electronic components, 1, mounted thereon for the purposes of illustration. The number of electronic components is not particularly limiting and may be individual electronic components in rows or stacks of electronic components. Microphonic isolation pads, 600, are shown in top schematic view in FIG. 38, bottom schematic view in FIG. 39 and side schematic view in FIG. 40. In FIGS. 38-40 circuit board substrates, 340, in the form of strips are attached to a conductive metal layer by a TLPS interconnect extending through a via of the compliant non-metallic layer, 502. Solder pads, 350, on the opposite side of the microphonic isolation pad, relative to the electronic component, are in electrical contact with the solder pads by electrical traces and vias as described above. A solder mask or compliant non-metallic layer is between the external termination of the electronic component and the conductive metal layer thereby providing microphonic suppression. Microphonic isolation pads are preferably used in pairs with each having a different polarity.

Figure 41:
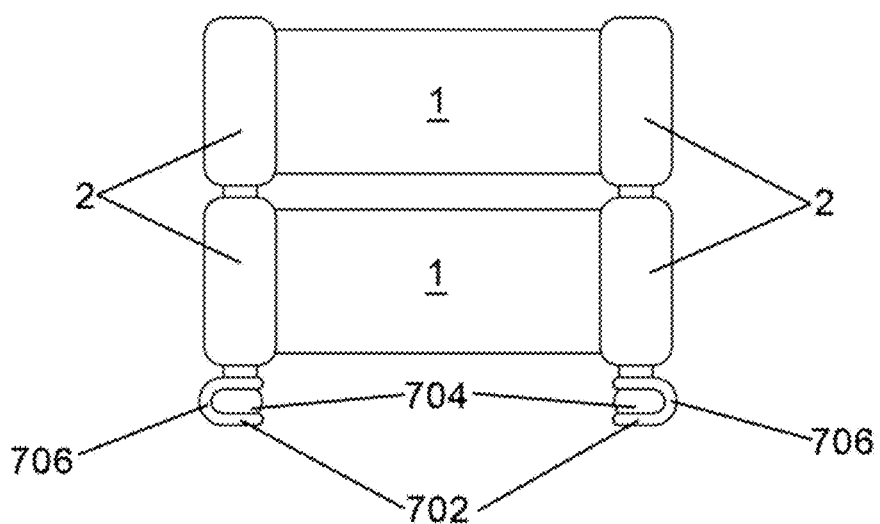
FIG. 41 is a schematic side view of an embodiment of the invention.

An embodiment of the invention will be described with reference to FIG. 41 wherein a microphonic noise reduction structure in the form of a shock absorbing conductor, 702, is mounted between the electronic component, 1, and in electrical contact with the external terminations, 2, as described elsewhere herein. A shock absorbing conductor comprises a shape comprising offset mounting tabs with a space there between coupled with at least one flexible stress relieving portion, 706, and therefore capable of absorbing vibration. Shock absorbing structures may include open shapes such as a "C", "S" or "Z" or closed shapes such as a rounded or rectangular shape. Compliant non-metallic layers, 704, can be included as a preform or filler within the interstitial areas of the shock absorbing conductor to further dampen mechanical vibrations thereby further reducing microphonic noise. The shock absorbing structures can be made from ferrous and non-ferrous electrically conductive materials or alloys with Alloy 42, Kovar, Invar, Phosphor Bronze or Cu being suitable for demonstration of the invention. The thickness of shock absorbing structures are limited on the lower end by conductivity and manufacturability. In one embodiment a preform has a conductor coated thereon which allows for a thickness approaching the number of atomic layers required for electrical conductivity. A thickness of at least 25.4 µm (0.0001 inches) and preferably 0.0254 mm (0.001 inches) to no more than 0.127 mm (0.005 inches) thick and more preferably no more than 0.0635 mm (0.0025 inches thick) is suitable for demonstration of the invention. The height of the shock absorbing structure or offset height, as measured perpendicular to the circuit board, is preferably at least 0.0254 mm (0.001 inches) to no more than 0.127 mm (0.005 inches) and more preferably no more than 0.0635 mm (0.0025 inches thick).

The substrate, or circuit boards, are not particularly limiting herein with standard PCB materials including FR4, polyimides, Kapton, PEEK or electronic grade ceramic such as $Al_2O_3$ (alumina oxide) or yttria stabilized zirconia being suitable for demonstration of the invention. Another consideration and design form uses either ferrous alloys such as Alloy 42, Invar, or Kovar or non-ferrous materials such as Cu, Phosphor Bronze, BeCu.

Particularly preferred compliant non-metallic layers are selected from materials selected from FR4, perflouroelastomers, polyimide, kapton, peek, electronic grade ceramics, such as yttrium stabilized zirconia or $Al_2O_3$ (alumina oxide), and the like.

EXAMPLES

The slump test is based on a visible observation, preferably with magnification, wherein the part is inspected after treatment to see if the MLCC has moved, or slumped, within the lead frame. Slumping indicates that the reflow process has caused the integrity of the bond to the lead frame to be compromised. A movement of the MLCC within the lead frame or a visual indication of a loss of bond integrity indicates a failure.

Example 1: Mechanical Robustness of Polymer Solder

Sixty-eight identical stacks each having 2 MLCC's with a case size of 5.6 mm×5.1 mm (0.22×0.20 inches) mounted in a common lead frame were manufactured. The stacks were separated into two equal sets of 34 each. In Set 1 the lead frame was attached to each MLCC using 1 mg of Sn/Sb solder with 91.5 wt % Sn and 8.5 wt % Sb. In Set 2 a lead frame was attached to each MLCC using 1 mg of Sn/Sb polymer solder with 91.5 wt % Sn and 8.5 wt % Sb available from Henkel as 10048-11A polymer solder. Each component was passed through a solder reflow oven at 260° C. three times and the part examined after each pass to determine the number of chips slumped. The results are provided in Table 1 wherein the cumulative number of failed parts is recorded after each pass.

TABLE 1

| Adhesive type | Pass #1 | Pass#2 | Pass#3 |
| --- | --- | --- | --- |
| Set 1 | 4 | 5 | 6 |
| Set 2 | 0 | 0 | 0 |

The results in Table 1 indicate that, for Set 1, 4 parts failed in the first pass and one additional part failed in subsequent passes whereas none of Set 2 failed. The polymer solder is therefore added additional mechanical strength at elevated temperature compared to the solder of the control samples.

Example 2: Improved Mechanical Robustness of TLPS

Similar stacks were manufactured with silver or tin plated lead frames and attached with a Cu-based transient liquid phase sintering adhesive available as Ormet 328. The samples did not exhibit any slumping or external lead detachment. A load test was then conducted as described in U.S. Pat. No. 6,704,189 wherein the stacks were placed in an oven with a 30 g weight attached to the MLCC and suspended below the stack. The temperature was increased above 260° C. in steps of at least 10° C. with a 10 minute dwell at each temperature. The parts were then examined for slumping and or external lead detachment failures. In the case of tin plated external lead frames failures were detected at 360° C. but for silver plated lead frames the first failures were detected at 630° C. demonstrating a superior high temperature mechanical performance for TLPS.

Example 3: Temperature Capability of Polymer Solder

Figure 13:
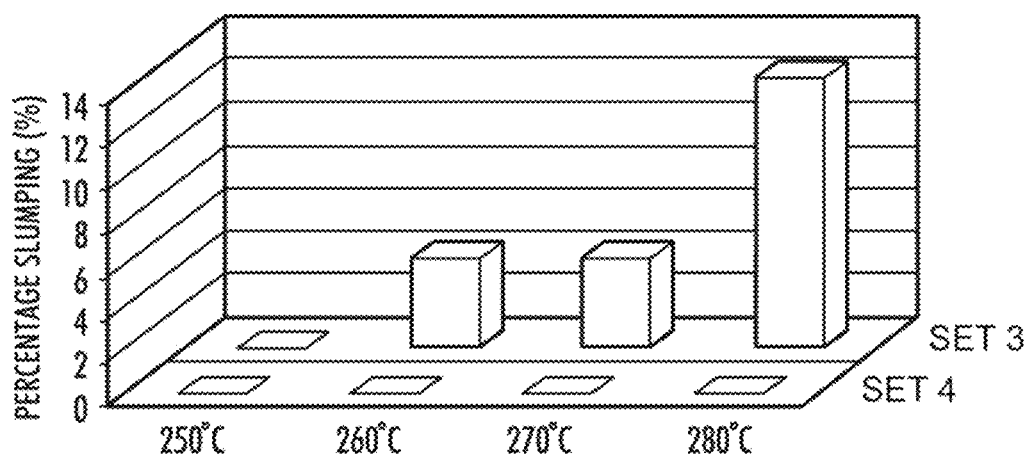
FIG. 13 is a graphical representation of an embodiment of the invention

One hundred and twenty J-lead style stacks were manufactured using identical MLCC's, identical J-leads and thermo-compression bonding process. The samples were split into groups of 30 and each bonded using various volumes of 91.5/8.5 Sn/Sb solder, available as Henkel 92ADA1OODAP85V EU 2460, for Set 3 and polymer solder, available as Henkel 20048-11A, for Set 4 containing the same solder composition. The samples were then sent through various soldering ovens over three passes and at different temperatures. The samples were then assessed for part slumping. The results are shown in FIG. 13. No slumping was detected in the polymer solder samples indicating improved high temperature robustness with the tested range. Polymer solder will not withstand temperatures above 350° C.

Example 4: Durability of Polymer Solder to High Speed Secondary Assembly Processes J-lead style stacks were manufactured using identical MLCC's, identical J-leads and a thermo-compression bonding process. Controls were prepared using 91.5/8.5 Sn/Sb solder available as Henkel 92ADA1OODAP85V EU 2460. Set 5 was prepared using a polymer solder containing the same solder composition available as Henkel 20048-11A. The samples were subsequently assembled onto FR4 boards with a standard solder and sent through an IR reflow oven using a faster temperature ramp rate than recommended for the soldered lead frames. The samples were examined for slumping or lead frame contact failure. The samples containing the Sn/Sb solder had 9 failures of 15 samples whereas the polymer solder had 0 failures of 15 samples demonstrating the increased robustness with respect to high speed assembly. The parts were subjected to the same high-speed assembly.

Example 5: Thermo-Compression Bonding

Figure 14:
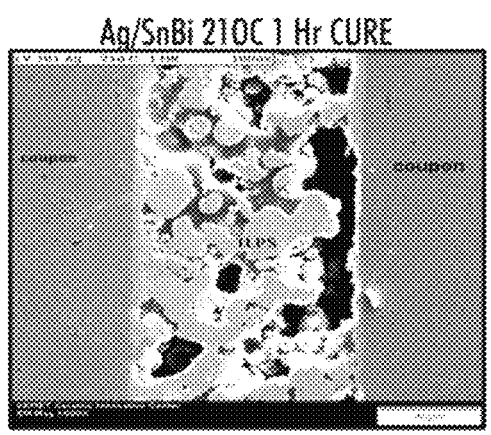
FIGS. 14 and 15 are electron micrographs of cross-sections of coupons bonded in accordance with an embodiment of the invention.
Figure 15:
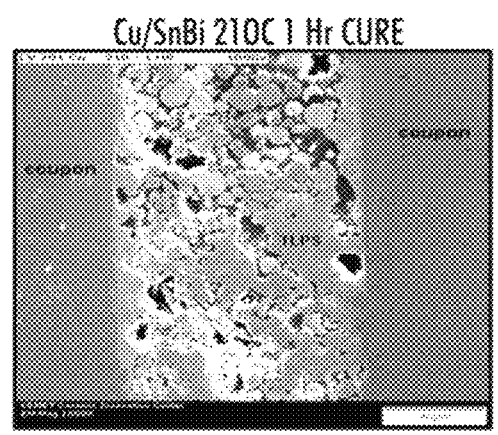
Figure 16:
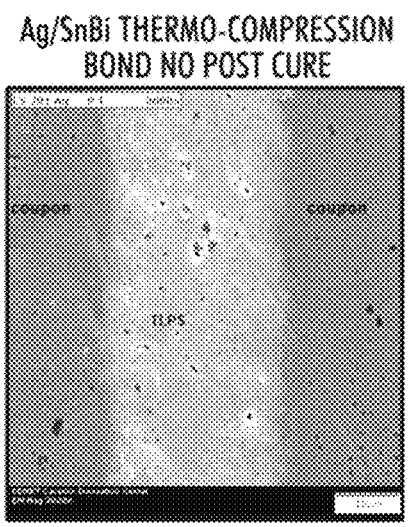
FIGS. 16 and 17 are electron micrographs of cross-sections of coupons bonded in accordance with an embodiment of the invention.
Figure 17:
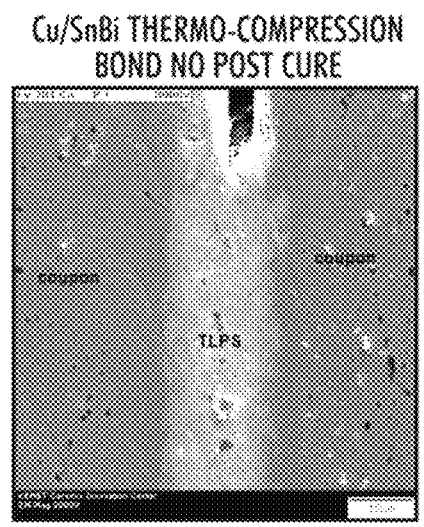

FIGS. 14 and 15 are photomicrographs demonstrating the bonds achieved using TLPS Ag/Sn/Bi, available as Ormet 701 Series, and Cu/Sn/Bi, available as Ormet 280 CE Series, to bond between coupons of Ag plated phosphor bronze using an IR reflow process. Significant areas of voids are present. FIG. 16 is a photomicrograph showing the TLPS Cu/Sn/Bi after a thermo-compression bonding process and FIG. 17 is a photomicrograph showing the Cu/Sn/Bi after a thermo-compression bonding process. In both instances a dense microstructure is observed. Thermo-compression can be achieved very quickly such as in less than 5 minutes with 2-10 pounds of compression.

Coupons were prepared in an analogous fashion to Example 4. A 30 g weight was suspended from the device thereby placing a stress on the thermo-compression bond. The bond was subjected to increasing temperatures. No failures were observed even with heating up to 850° C.

On observation, with lead attachments using Cu/Sn/Bi TLPS available as Ormet 701 and 10/88/2 Sn/Pb/Ag solder the TLPS remains where it was deposited whereas solder flows on heating. Solder requires the use of solder dams and resists when used with external lead attachment whereas TLPS does not. This provides a significant manufacturing advantage.

Figure 18:
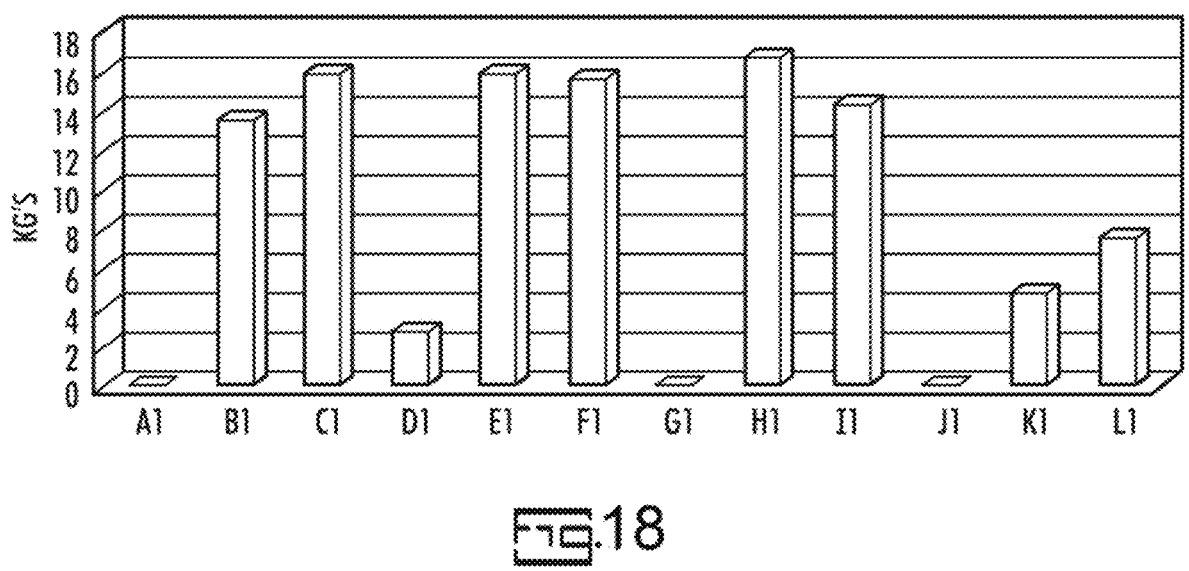
FIGS. 18-21 are graphical representations illustrating advantages provided by the invention.

Ormet 701 Cu/Sn/Bi TLPS to bond matte plated Sn Phosphor bronze coupons using thermo-compression bonding at various conditions with and without post curing. These results are compared to a 91.5Sn/8.5Sb solder. In FIG. 18, Sample A1 was heated at 180° C., for 20 seconds with no post sinter, Sample B1 was heated at 180° C. for 15 sec. with a 20 minute post sinter at 210° C. Sample C1 was heated at 180° C. for 20 sec. with a 30 minute post sinter at 210° C. Sample D1 was heated at 190° C. for 20 sec. with no post sinter. Sample E1 was heated at 190° C. for 20 sec. with a 15 minute post sinter at 210° C. Sample F1 was heated at 190° C. for 20 sec. with a 30 minute post sinter at 210° C. Sample G1 was heated at 200° C. for 20 sec. with no post sinter. Sample H1 was heated at 200° C. for 20 sec. with a 15 minute post inter at 210° C. Sample I1 was heated at 200° C. for 20 sec. with a 30 minute post at 210° C. Sample J1 was heated at 200° C. for 10 sec. with no post sinter. Sample K1 was heated at 230° C. for 10 sec. with no post sinter. Sample L1 was heated at 210° C., mimicking a post sinter, for 30 minutes using 91.5Sn/8.5Sb solder. These examples demonstrate that an initial bond can be made at lower temperatures and the bond strength can be increased significantly by post sintering.

Example 6

Figure 19:
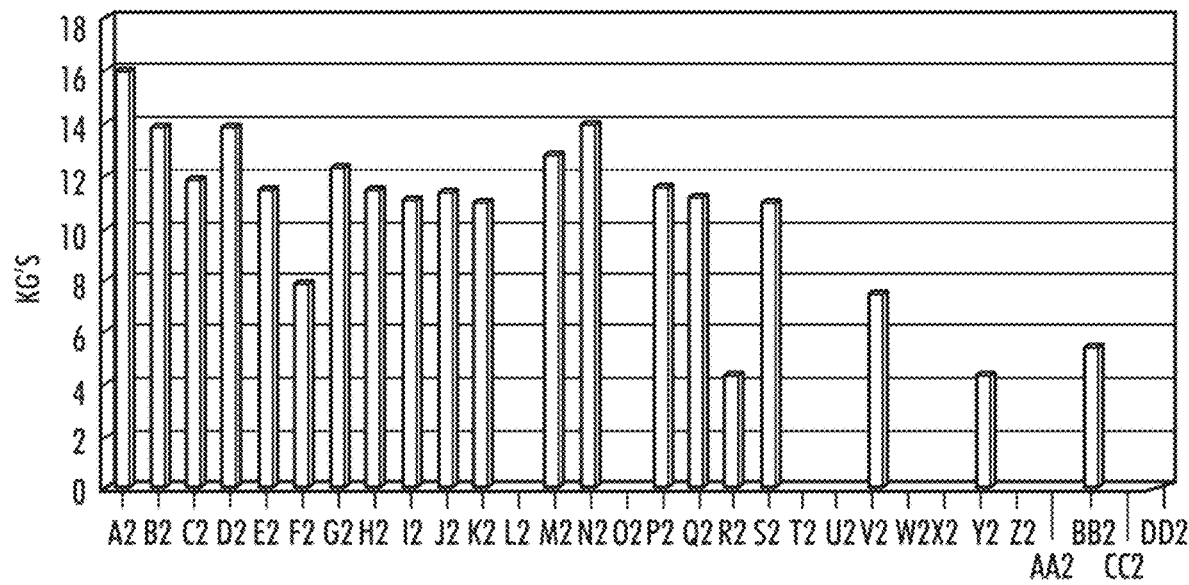

A set of experiments, similar to Example 5, was performed using Ormet 280CE Ag/Sn/Bi on a silver plated coupon. The results are provided in a bar graph in FIG. 19. In the examples the external lead exhibits a shear strength, measured as peak pull (in Kg) to failure, which exceeds the solder even though no post cure was used in the thermo-compression process. In each case the samples were heated at a first temperature for a first period consistent with a preheat, then the temperature was ramped to a second temperature in three seconds and the samples were held at the second temperature for a period of time. In FIG. 19 Sample A2 was preheated at 140° C. for 10 sec., the temperature was ramped to 300° C. and held for 20 sec. Sample B2 was preheated at 140° C. for 10 sec., the temperature was ramped to 300° C. and held for 10 sec. Sample C2 was preheated at 140° C. for 10 sec., the temperature was ramped to 300° C. and held for 5 sec. Sample D2 was preheated at 140° C. for 3 sec., the temperature was ramped to 300° C. and held for 20 sec. Sample E2 was preheated at 140° C. for 3 sec., the temperature was ramped to 300° C. and held for 10 sec. Sample F2 was preheated at 140° C. for 3 sec., the temperature was ramped to 300° C. and held for 5 sec. Sample G2 was preheated at 140° C. for 10 sec., the temperature was ramped to 280° C. and held for 20 sec. Sample H2 was preheated at 140° C. for 10 sec., the temperature was ramped to 280° C. and held for 10 sec. Sample I2 was preheated at 140° C. for 10 sec., the temperature was ramped to 280° C. and held for 5 sec. Sample J2 was preheated at 140° C. for 3 sec., the temperature was ramped to 280° C. and held for 20 sec. Sample K2 was preheated at 140° C. for 3 sec., the temperature was ramped to 280° C. and held for 10 sec. Sample L2 was preheated at 140° C. for 3 sec., the temperature was ramped to 280° C. and held for 5 sec. Sample M2 was preheated at 140° C. for 10 sec., the temperature was ramped to 260° C. and held 20 sec. Sample N2 was preheated at 140° C. for 10 sec, ramped to 260° C. and held for 10 sec. Sample O2 was preheated at 140° C. for 10 sec., the temperature was ramped to 260° C. and held for 5 sec. Sample P2 was preheated at 140° C. for 3 sec., the t temperature was ramped to 260° C. and held for 20 sec. Sample Q2 was preheated at 140° C. for 3 sec., the temperature was ramped to 260° C. and held for 10 sec. Sample R2 was preheated at 140° C. for 3 sec., the temperature was ramped to 260° C. and held for 5 sec. Sample S2 was preheated at 140° C. for 10 sec., ramped to 240° C. and held for 20 sec. Sample T2 was preheated at 140° C. for 10 sec., the temperature was ramped to 240° C. and held for 10 sec. Sample U2 was preheated at 140° C. for 10 sec., the temperature was ramped to 240° C. and held for 5 sec. Sample V2 was preheated at 140° C. for 3 sec., the temperature was ramped to 240° C. and held for 20 sec. Sample W2 was preheated at 140° C. for 3 sec., the temperature was ramped to 240° C. and held for 10 sec. Sample X2 was preheated at 140° C. for 3 sec., the temperature was ramped to 240° C. and held for 5 sec. Sample Y2 was preheated at 140° C. for 10 sec., the temperature was ramped to 220° C. and held for 20 sec. Sample Z2 was preheated at 140° C. for 10 sec., the temperature was ramped to 220° C. and held for 10 sec. Sample AA2 was preheated at 140° C. for 10 sec., the temperature was ramped to 220° C. and held for 5 sec. Sample BB2 was preheated at 140° C. for 3 sec., the temperature was ramped to 220° C. and held for 20 sec. Sample CC2 was preheated at 140° C. for 3 sec., the temperature was ramped to 220° C. and held for 10 sec. Sample DD2 was preheated at 140° C. for 3 sec., the temperature was ramped to 220° C. and held for 5 sec. The results of Example 6 demonstrate the time temperature effect on the TLPS process without post sintering.

Example 7: TLPS Termination

TLPS Cu/Sn/Bi, available as Ormet 701, was cured onto nickel base metal electrode MLCC's to form a termination directly to the nickel inner electrodes. The average capacitance was 0.32 µF similar to that for standard high fire termination materials indicating a bond with a continuous conductive pathway had been formed to the inner electrodes.

Example 8: Temperature Durability Test

Figure 20:
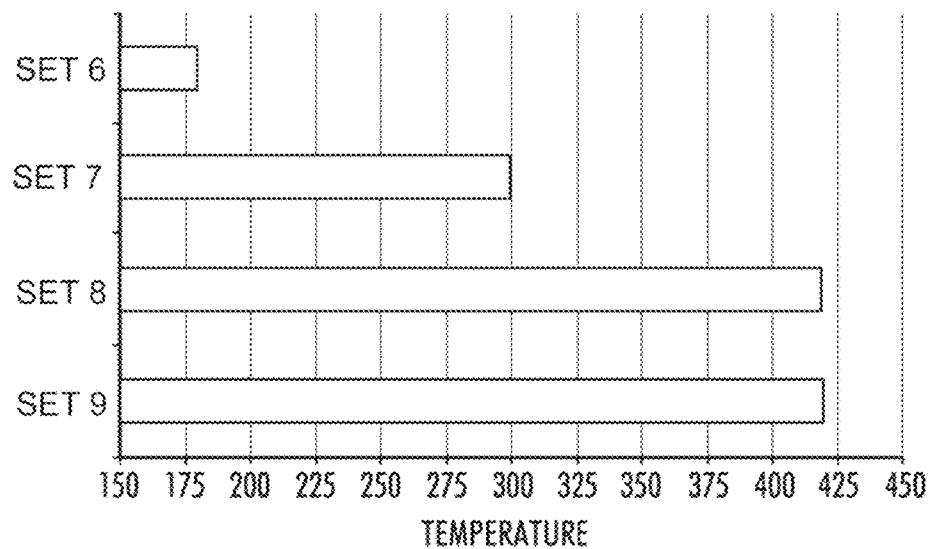

To test the strength of the adhesive bond a load test was done in accordance with U.S. Pat. No. 6,704,189 wherein the externally leaded part is suspended in air with a 30 gram weight attached to the bottom external lead. The suspended part and weight are subjected to increasing temperatures until failure is detected by detachment of the external lead wires. The results are presented in FIG. 20 wherein the polymer solder demonstrates a significantly better bond strength, as a function of temperature, than 88Pb/10Sn/2Ag solder. In FIG. 20, Set 6 was bonded using 88Pb/10Sn/2Ag solder. In Set 7 a nickel/tin lead was bonded with conductive adhesive. Set 8 was bonded to a nickel/gold lead using conductive adhesive. Set 9 was bonded to a nickel/silver lead with a 95Sn/5Ag solder dot in the center and conductive adhesive on the nail head.

Figure 21:
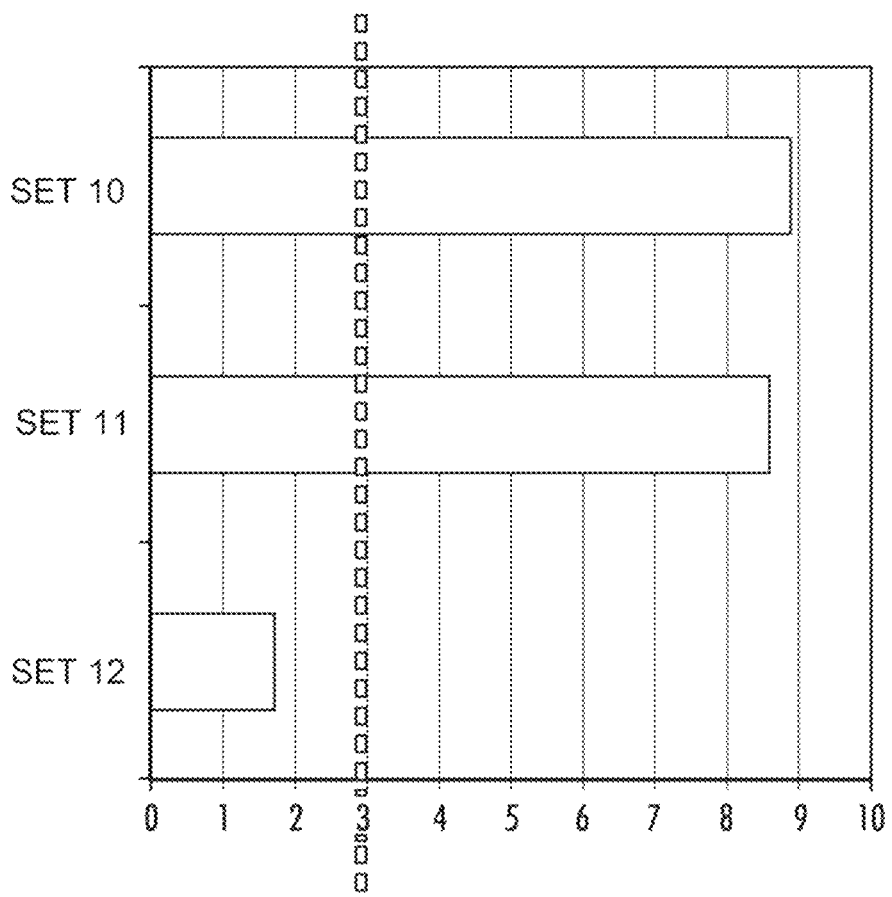

Similar samples were subjected to a shear strength test conducted in accordance with MIL-STD-202G, Method 211, Test Condition A, Procedure 3.1.3 wherein the load applied is axial to the capacitor terminals and the force is increased until the device fails. The results are provided in FIG. 21. In FIG. 21, Set 10 utilized a dot of polymer solder with Sn95/Ag5 which was reflowed then bonded to a silver plated nail head with conductive adhesive and post reflow cured. Set 11 used Sn95/Ag5 solder and Set 12 used a conductive adhesive to bond to a silver plated lead wire. As demonstrated the conductive epoxy exhibited a poor shear adhesion of less than 3 lbs. resulting in inadequate handling strength for processing.

The inventive sample withstands greater than 400° C. with a 30 gram weight suspended from the external lead wire. Conductive adhesive alone survived >300° C. temperatures, but exhibits poor shear adhesion at room temperature as shown in FIG. 21. This is not acceptable for processing and handling of the part after joining such is common during assembly of subcomponents and electronic devices. Shear testing showed an acceptable room temperature shear strength of >3 lbs.

Example 9

Figure 22:
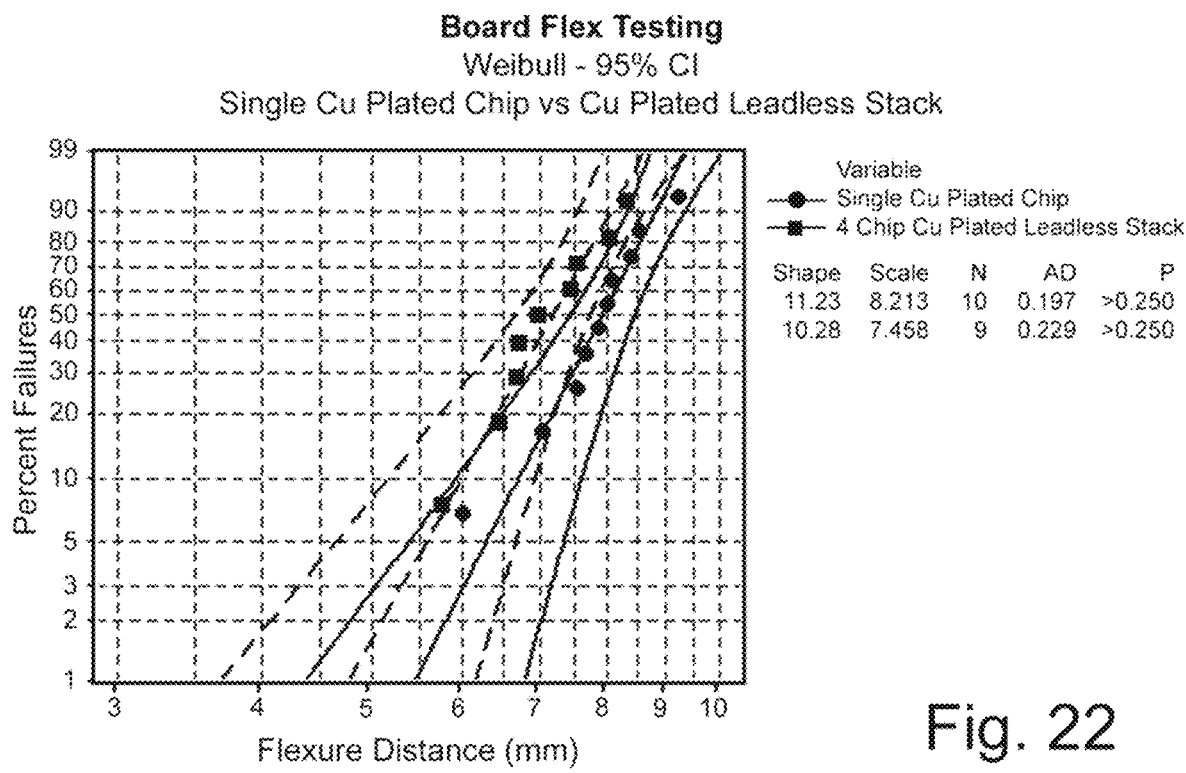
FIGS. 22 and 23 are graphical illustration of board flexure testing results.
Figure 23:
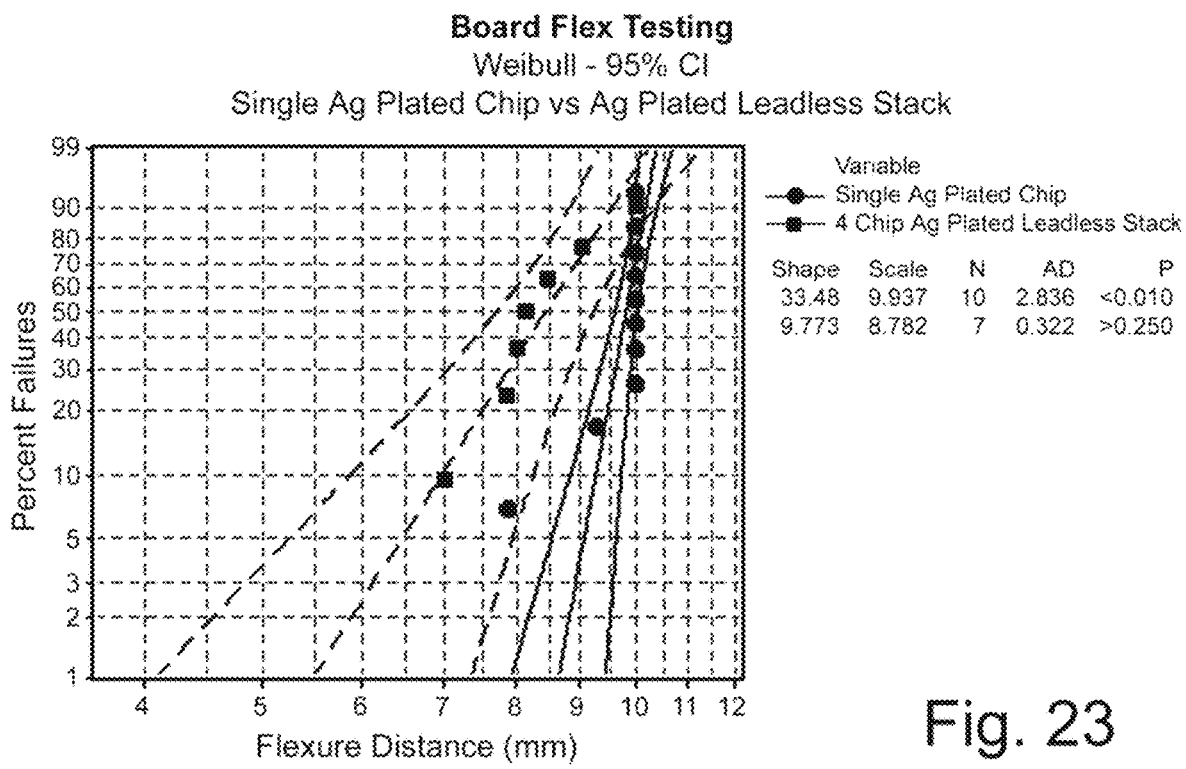

Case size 2220, 0.47 µF, 50V rated MLCC with COG dielectric ceramic based on calcium zirconate and nickel internal electrodes where manufactured by processes well known in the prior art. These were terminated using a copper thick film paste containing a glass frit. Samples where made with two different types of electrolytic plating. A nickel plating was applied to the fired copper termination followed by copper plating in one case and silver plating in the other. All the plating layer were done to a minimum of 5 microns (200µinch). Leadless stacks were produced for both MLCC plating types using a TLPS paste, Ormet CS510, containing mainly of copper and tin metal particles. The stacks were manufactured by dispensing a thin bead of TLPS paste along the top surface of the plated terminations to be bonded. In this way 4-chip stacks were assembled with the Ormet CS510 along the terminations of adjacent capacitors. These were clamped in an assembly and heated to peak temperature of 330° C. remaining above 300° C. for 90 seconds using a Heller oven under nitrogen atmosphere. Board flexure performance of samples of these leadless stacks were compared to the single MLCC by flexing to 10 mm using the test method described by AEC-Q200-005 Rev A. The flexure was applied at a rate of 1 mm/second with capacitance losses of 2% being recorded as failures. The samples were connected to the test circuit boards using reflowed tin-lead (SnPb) solder. These results are shown as Weibull graphs for the copper and silver plated parts in FIGS. 22 and 23 respectively. Although the stack performance is slightly worse than the single MLCC the flexure failures for leadless stacks made with both types of plating are well above the 3 mm minimum required by AEC for COG type MLCC.

Example 10

Figure 26:
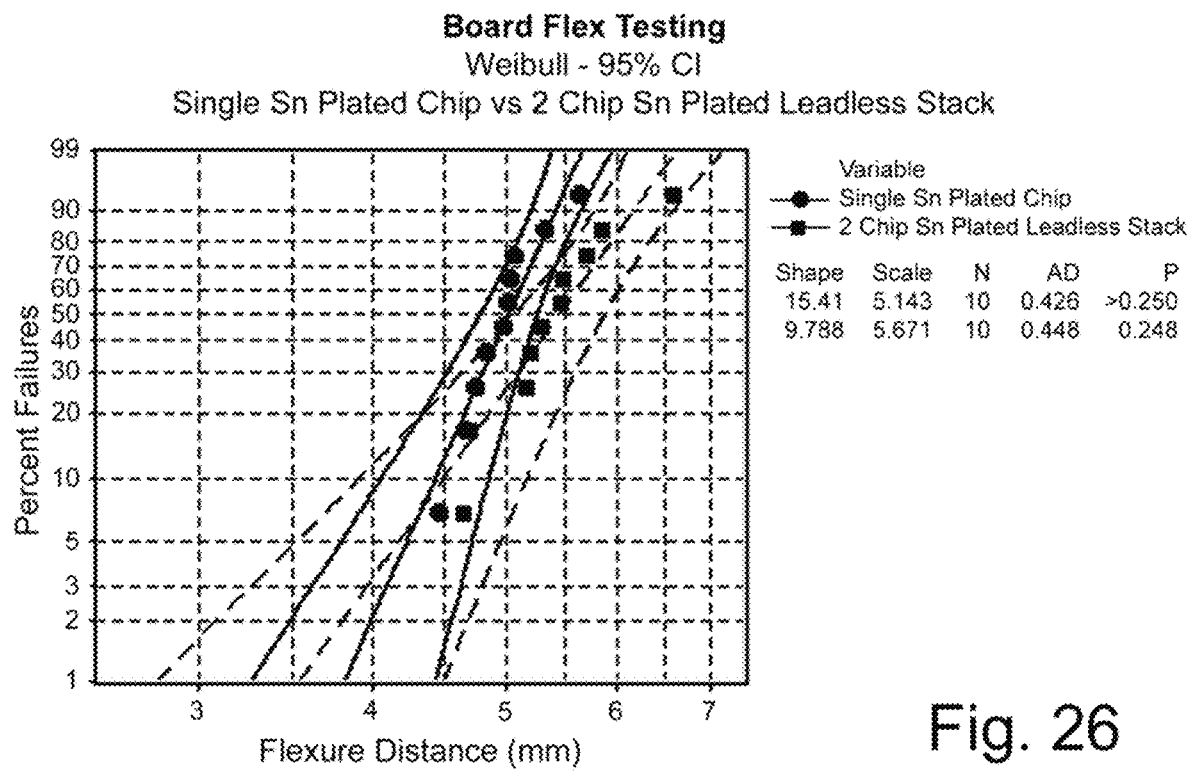
FIGS. 26 and 27 are graphical illustrations of board flexure testing results.
Figure 27:
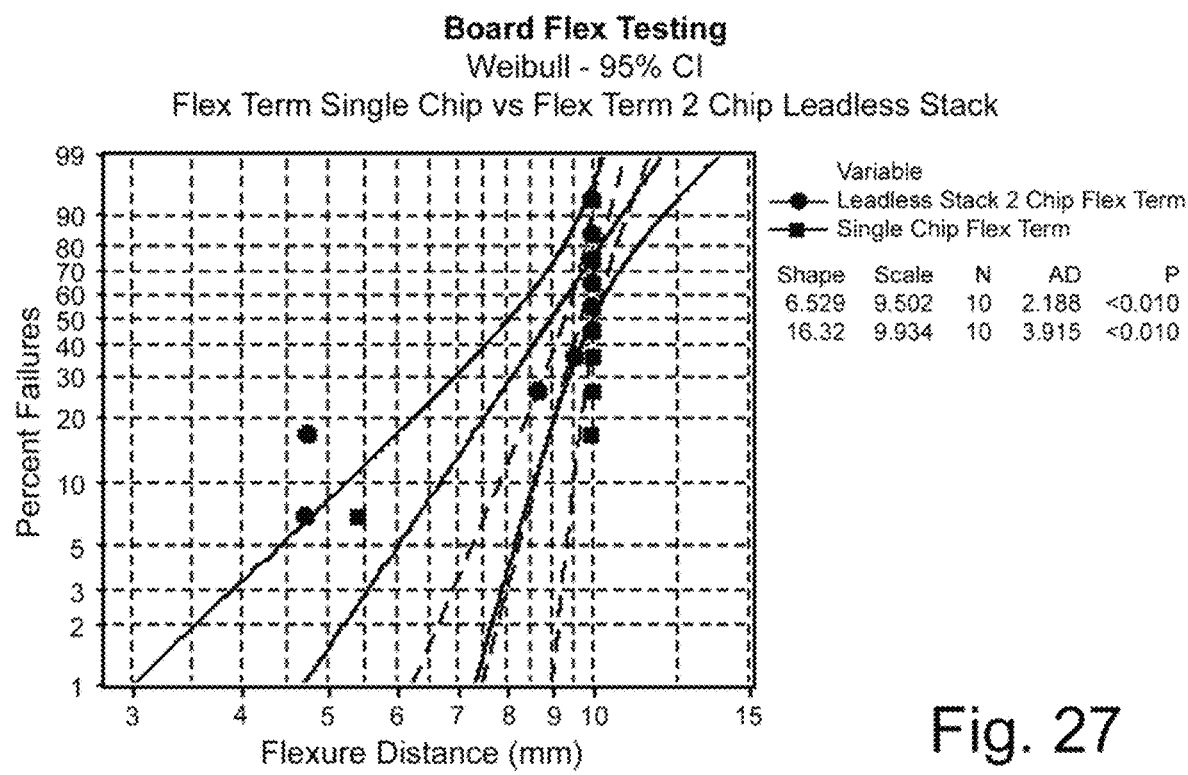

Case size 2220, 0.50 µF, 500V rated MLCC with X7R dielectric ceramic based on barium titanate and nickel internal electrodes where manufactured by processes well known in the prior art. These were terminated using a copper thick film paste containing a glass frit. Samples were then plated with electrolytic nickel (minimum of 50µinch) followed by tin (minimum of 100µinch). Leadless stacks of 2 MLCC were made using a TLPS paste, Ormet CS510, by dispensing a thin bead of TLPS paste along the top surface of the plated terminations to be bonded. These were clamped in an assembly and heated to peak temperature of 330° C. remaining above 300° C. for 90 seconds using a Heller oven under nitrogen atmosphere. Board flexure performance of these leadless stacks were compared to the single MLCC by flexing to 10 mm using the test method described by AEC-Q200-005 Rev A. The flexure was applied at a rate of 1 mm/second with capacitance losses of 2% being recorded as failures. The samples were connected to the test circuit boards using reflowed tin-silver-copper (SAC) solder. These results are shown as Weibull graphs in FIG. 26. The leadless stack performance is similar to the single chip MLCC and both are well above the 2 mm minimum required by AEC for X7R type MLCC. FIG. 27 illustrates the flexure of a single chip with a flex term to that of a 2 chip leadless stack with flex term and that the bulk of the distribution is well above 6 mm of flexure.

A further comparison between leaded stacks can be seen in example 11 that compares high temperature capability of a control group of leaded stacks interconnected with SnSb solder with that of leaded stacks interconnected with TLPS (CS510).

Example 11

Table 2 demonstrates the high temperature capability of the TLPS material CS510 with that of the control group built with caps having the standard Cu/Ni/Sn termination, a lead frame finish of Sn, and the capacitor stack and lead frame terminated with standard SnSb solder. The test groups indicate the results of using various capacitor termination metallizations and different lead frame surface finishes as well as no capacitor termination and using the CS510 TLPS interconnect to make both the electrical and mechanical connection between the internal electrodes and the lead frame. It can be seen from Table 2 that the control group when heated and suspended with a hanging 30 gram weight attached failed in a temperature range of 230 to 235 C. The samples made with Ormet CS510 regardless of capacitor termination metallization type including the non-terminated capacitor reached the test limit of 600 C and having no failures. The only exception was the test group that used Sn on both the termination and the lead frame surface which exhibited failures in the range of 420-450° C.

TABLE 2

Comparative Hanging Weight Test
Comparitive Hanging Weight Test Results

| Part | Test Samples | Termination | Lead Finish | Inter-connect | Heated Hg. Wt. 30 g Temp Fail? (° C.) |
|---|---|---|---|---|---|
| 2220 504 500 V | Control Group | Cu/Ni/Sn | Sn | SnSb Solder | 230-235 Failues |
| | Test Groups | Cu/Ni/Sn | Sn | CS510 | 420, 450 Failures |
| | | Cu Frit | Sn | CS510 | 600 No Failures |
| | | | Cu | CS510 | 600 No Failures |
| | | | Ag | CS510 | 600 No Failures |
| | | Non Terminated | Cu | CS510 | 600 No Failures |

Example 12

Figure 24:
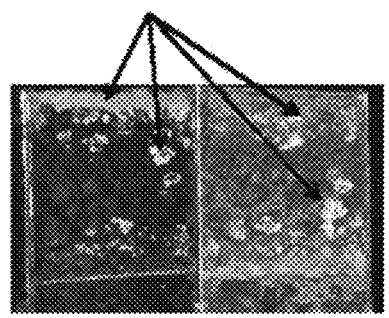
FIG. 24 is an electron micrograph of sheared overlap joint of two coupons having plated surfaces.
Figure 25:
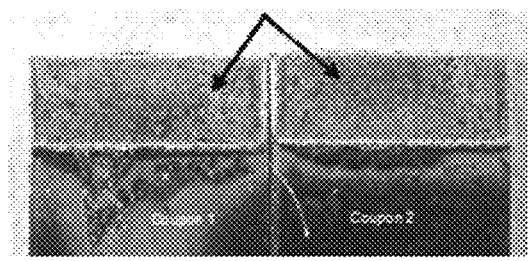
FIG. 25 illustrates two coupons bonded with TLPS paste in accordance with an embodiment of the invention.

A comparison of the embodiment of this invention is illustrated in FIG. 25 and compared to two plated coupons as illustrated in FIG. 24. In FIG. 24 two copper coupons are illustrated with one plated with Ni and over plated with Ag and the second copper coupon plated with Ni and overplated with Ag and then In. The two coupons were then placed face-to-face and heated to initiate the diffusion of indium. After processing, the two coupons were subjected to a shear test and pulled until joint failure occurred. The results demonstrate the need for intimate contact surface between the mating parts to ensure maximum joint strength and uniform diffusion. The arrows in FIG. 24 indicates isolated points of contact across the joint area where diffusion took place. The joint surface area is a 3.81×3.81 mm (0.150"× 0.150") square or 14.52 mm$^2$ (0.0225 in$^2$) and the joint shear strength of 266 psi. However, there is an estimated 20% surface contact area. This clearly demonstrates the need for intimate contact between the mating surfaces in order to maximize joint strength.

FIG. 25 illustrates the same type of coupon as illustrated in FIG. 24, plated with 2.5 microns (100 micro-inch) of Ni and 5 microns (200 micro-inch) of Ag and bonded to a second like coupon using In paste. The surface coverage was 100% and uniform and the shear strength recorded was 9000 psi. The assembly, processing, and shear methods were exactly the same thus demonstrating the difference of trying to bond two non-planar surfaces together vs bonding two non-planar surfaces together using an Indium paste.

The invention has been described with reference to the preferred embodiments without limit thereto. One of skill in the art would realize additional embodiments and alterations which are not specifically set forth but which are within the scope of the claims appended hereto which form an integral part of the instant application.

The invention claimed is:

1. An electronic device comprising:
a substrate with a first conductive metal layer and a second conductive metal layer;
a first microphonic noise reduction structure in electrical contact with said first conductive metal layer wherein said first microphonic noise reduction layer comprises a compliant non-metallic layer and a shock absorbing conductor comprising offset mounting tabs with a space there between coupled with at least one stress relieving portion;
an electronic component comprising a first external termination of a first polarity and a second external termination of a second polarity wherein said first microphonic noise reduction structure is only between said first conductive metal layer and said first external termination; and
said first microphonic noise reduction structure and said first external termination are adhesively bonded by only a transient liquid phase sintering adhesive through said compliant non-metallic layer thereby providing a reduced size of said transient liquid phase sintering adhesive on said first conductive metal layer available for electrical or mechanical attachment of said first external termination to said first conductive metal layer by said transient liquid phase sintering adhesive.

2. The electronic structure of claim 1 wherein said compliant non-metallic layer comprises a material selected from the group consisting of FR4, perflouroelastomers, polyimide, kapton, peek and electronic grade ceramics.

3. The electronic structure of claim 1 wherein said compliant non-metallic layer comprises a gap and said transient liquid phase sintering adhesive extends through said gap.

4. The electronic device of claim 3 wherein said compliant non-metallic layer comprises a via comprising said gap.

5. The electronic device of claim 3 wherein said compliant non-metallic layer comprises strips with said gap between said strips.

6. The electronic device of claim 1 wherein said compliant non-metallic layer has a thickness of at least 25 µm to no more than 1.575 mm.

7. The electronic device of claim 1 further comprising a second compliant non-metallic layer wherein said second compliant non-metallic layer comprises a second gap and a second conductive adhesive is in electrical contact with said first external termination and a second conductive layer through said second gap.

8. The electronic device of claim 1 wherein said transient liquid phase sintering conductive layer comprises at least one low melting point metal selected from indium, tin, antimony, bismuth, cadmium, zinc, gallium, tellurium, mercury, thallium, selenium, or polonium, lead.

9. The electronic device of claim 1 wherein said transient liquid phase sintering conductive layer comprises a high temperature metal selected from the group consisting of silver, copper, aluminum, gold, platinum, palladium, beryllium, rhodium, nickel, cobalt, iron and molybdenum.

10. The electronic device of claim 1 wherein said transient sintering conductive layer further comprises a non-metallic filler.

11. The electronic device of claim 10 wherein said non-metallic filler is glass frit.

12. The electronic device of claim 1 wherein said first conductive metal layer comprises a metal selected from the group consisting of Ni, Ag, Sn, Au, Cu, Al and SnPb.

13. The electronic device of claim 1 wherein said first conductive metal layer comprises nickel plated with an element selected from the group consisting of Ag, Sn, Au or SnPb.

14. The electronic device of claim 1 wherein said first external termination comprises nickel plated with an element selected from the group consisting of Ag, Sn, Au or SnPb.

15. The electronic device of claim 1 wherein said electronic component is a multilayered ceramic capacitor comprising first electrodes and second electrodes separated by a dielectric wherein said first electrodes terminate at said first external termination and said second electrodes terminate at said second termination.

16. The electronic device of claim 15 wherein said multilayered ceramic capacitor further comprises at least conductor selected from a floating electrode and a shield electrode.

17. The electronic device of claim 16 wherein said floating electrode is selected from the group consisting of an external floating electrode and an internal floating electrode.

18. The electronic device of claim 17 wherein said internal floating electrode is coplanar with at least one first electrode of said first electrodes.

19. The electronic device of claim 1 further comprising at least one second electronic component wherein said second electronic component comprises a first stacked external termination in electrical contact with said first external termination and a second stacked external termination in electrical contact with said first external termination.

20. The electronic device of claim 19 wherein said first stacked external termination is electrically connected to said first external termination by a transient liquid phase sintering conductive layer.

21. The electronic device of claim 19 comprising up to 50 second electronic components in a stack.

22. The electronic device of claim 1 wherein said first conductive metal layer is on a substrate.

23. The electronic device of claim 22 wherein said second conductive metal layer is on a second substrate.

24. The electronic device of claim 23 wherein said substrate and said second substrate are strips.

25. The electronic device of claim 22 wherein said substrate further comprises at least one trace in electrical contact with said first conductive metal layer.

26. The electronic device of claim 25 wherein said substrate further comprises at least one solder pad in electrical contact with at least one said trace.

27. The electronic device of claim 26 wherein said at least one solder pad is on an opposite side of said substrate from said first conductive metal layer.

28. The electronic device of claim 26 wherein said at least one solder pad is in electrical contact with at least one said trace through a via.

29. The electronic device of claim 22 wherein said substrate further comprises an elastomeric coating.

30. The electronic device of claim 29 wherein said elastomeric coating is on an opposite side of said substrate than said first conductive metal layer.

31. The electronic device of claim 22 wherein said substrate further comprises at least one mechanical solder pad which is not electrically connected.

32. The electronic device of claim 1 wherein said shock absorbing conductor has a shape selected from an open shape and a closed shape.

33. The electronic device of claim 32 wherein said shock absorbing conductor has a shape selected from C shaped, S shaped, Z shaped, rounded and rectangular.

34. The electronic device of claim 1 wherein said shock absorbing conductor has a height of at least 0.0254 mm to no more than 0.127 mm.

35. The electronic device of claim 1 wherein said shock absorbing conductor further comprises a preform or filler within an interstitial area.

36. The electronic device of claim 1 wherein said shock absorbing conductor comprises a material selected from the group consisting of ferrous and non-ferrous electrically conductive materials and alloys.

37. The electronic device of claim 36 wherein said shock absorbing conductor comprises a material selected from the group consisting of Alloy 42, Kovar, Invar, Phosphor Bronze and Cu.

\* \* \* \* \*